United States Patent
Lin et al.

(10) Patent No.: US 12,408,425 B2
(45) Date of Patent: Sep. 2, 2025

(54) SEMICONDUCTOR STRUCTURE WITH HIGH INTEGRATION DENSITY AND METHOD FOR MANUFACTURING THE SAME

(71) Applicant: TAIWAN SEMICONDUCTOR MANUFACTURING COMPANY, LTD., Hsinchu (TW)

(72) Inventors: Ta-Chun Lin, Hsinchu (TW); Ming-Heng Tsai, Hsinchu (TW); Huang-Chao Chang, Hsinchu (TW); Chun-Sheng Liang, Hsinchu (TW); Chih-Hao Chang, Hsinchu (TW); Jhon Jhy Liaw, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 427 days.

(21) Appl. No.: 18/169,628

(22) Filed: Feb. 15, 2023

(65) Prior Publication Data
US 2024/0088149 A1   Mar. 14, 2024

Related U.S. Application Data

(60) Provisional application No. 63/405,988, filed on Sep. 13, 2022.

(51) Int. Cl.
*H10D 84/85* (2025.01)
*H10D 30/01* (2025.01)
(Continued)

(52) U.S. Cl.
CPC .......... *H10D 84/85* (2025.01); *H10D 30/014* (2025.01); *H10D 30/43* (2025.01);
(Continued)

(58) Field of Classification Search
CPC .. H10D 84/85; H10D 84/0167; H10D 84/017; H10D 84/0188; H10D 84/038;
(Continued)

(56) References Cited

U.S. PATENT DOCUMENTS 10,879,351 B2 * 12/2020  Ching ................ H10D 84/0135
12,107,006 B2 * 10/2024  You ...................... H10D 30/031
(Continued)

*Primary Examiner* — Dao H Nguyen
(74) *Attorney, Agent, or Firm* — Cooper Legal Group, LLC

(57) ABSTRACT

A semiconductor structure includes: a substrate; a first fin and a second fin disposed on the substrate and spaced apart from each other; a dielectric wall disposed on the substrate and having first and second wall surfaces; a third fin disposed on the substrate to be in direct contact with at least one of the first and second fins; a first device disposed on the first fin and including first channel features extending away from the first wall surface; a second device disposed on the second fin and including second channel features extending away from the second wall surface; at least one third device disposed on the third fin and including third channel features; and an isolation feature disposed on the substrate to permit the third device to be electrically isolated from the first and second devices. A method for manufacturing the semiconductor structure is also disclosed.

20 Claims, 29 Drawing Sheets

(51) Int. Cl.
*H10D 30/43* (2025.01)
*H10D 30/67* (2025.01)
*H10D 62/10* (2025.01)
*H10D 62/13* (2025.01)
*H10D 64/01* (2025.01)
*H10D 84/01* (2025.01)
*H10D 84/03* (2025.01)

(52) U.S. Cl.
CPC ....... *H10D 30/6735* (2025.01); *H10D 62/121* (2025.01); *H10D 62/151* (2025.01); *H10D 64/017* (2025.01); *H10D 84/0167* (2025.01); *H10D 84/017* (2025.01); *H10D 84/0188* (2025.01); *H10D 84/038* (2025.01)

(58) Field of Classification Search
CPC .. H10D 84/0151; H10D 84/83; H10D 30/014; H10D 30/43; H10D 30/6735; H10D 30/6757; H10D 62/121; H10D 62/151; H10D 64/017
See application file for complete search history.

(56) References Cited

U.S. PATENT DOCUMENTS

| | | | |
|---|---|---|---|
| 2019/0305082 A1* | 10/2019 | Ching | H10D 84/0158 |
| 2021/0098471 A1* | 4/2021 | Chen | H01L 21/76877 |
| 2022/0130955 A1* | 4/2022 | Cheng | H10D 84/0158 |
| 2022/0359711 A1* | 11/2022 | Lu | H10D 84/0188 |
| 2024/0120377 A1* | 4/2024 | Lin | H10D 84/83 |

* cited by examiner

SEMICONDUCTOR STRUCTURE WITH HIGH INTEGRATION DENSITY AND METHOD FOR MANUFACTURING THE SAME

REFERENCE TO RELATED APPLICATION

This application claims priority of U.S. Provisional Patent Application No. 63/405,988, filed on Sep. 13, 2022, the contents of which is incorporated herein by reference in its entirety.

BACKGROUND

Transistors are key active components in modern integrated circuits (ICs). With rapid development of semiconductor technology, critical dimension (CD) of transistors keeps shrinking and various three-dimensional (3D) transistor structures are springing up, making it possible to integrate a large number of transistors per unit area. In addition, transistors in an IC may not be exactly the same, and may have difference in configuration and/or size, so that the transistors can be integrated together to form different operating units (e.g., memories, inverters, logic gates, flash, etc.) with different functions. Till date, advanced node 3D ICs including different operating units integrated therein are under continuous development.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
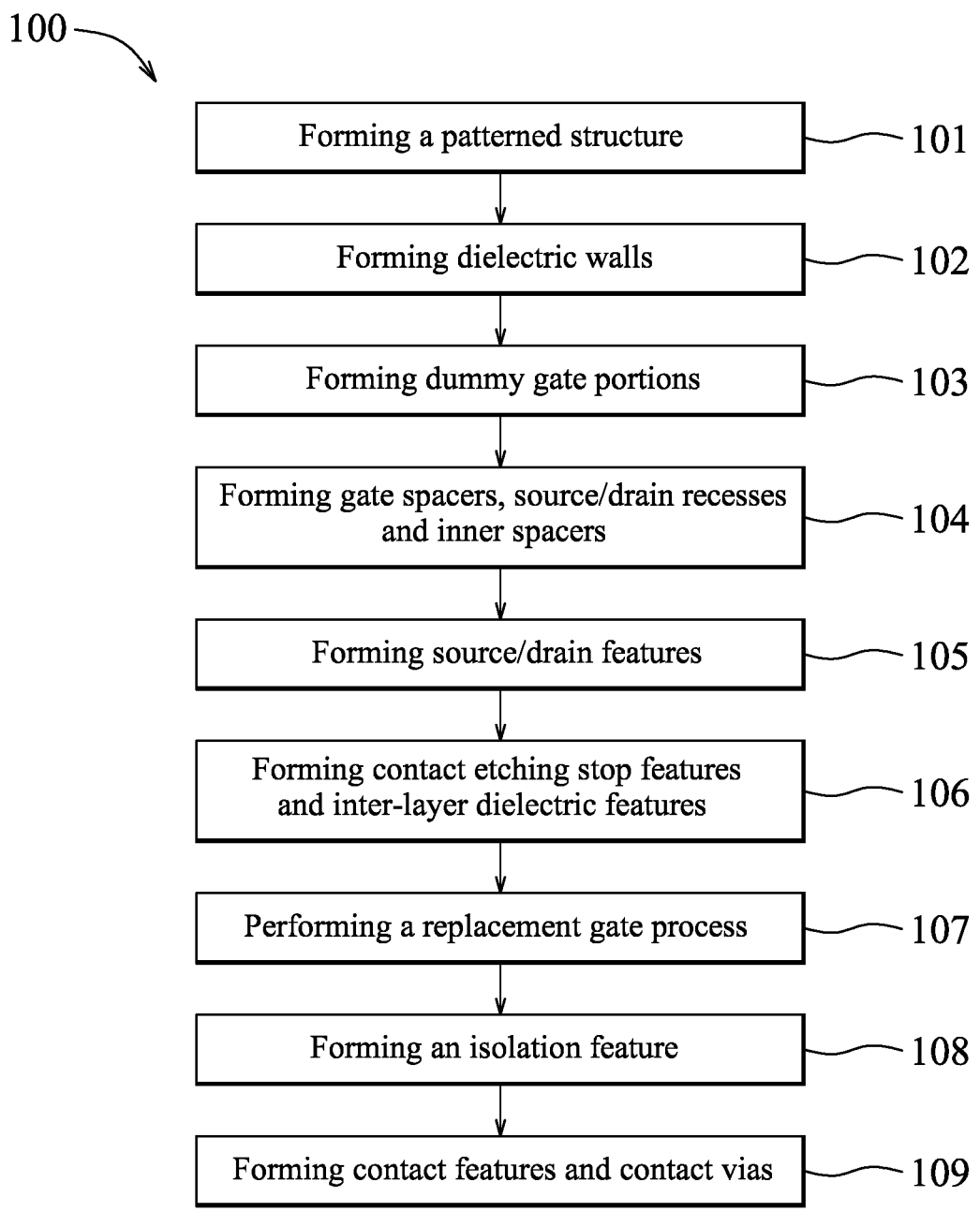
FIG. 1 is a flow diagram illustrating a method for manufacturing a semiconductor structure in accordance with some embodiments.

The following disclosure provides many different embodiments, or examples, for implementing different features of the disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "on," "above," "top," "bottom," "upper," "lower," "over," "beneath," and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Figure 2:
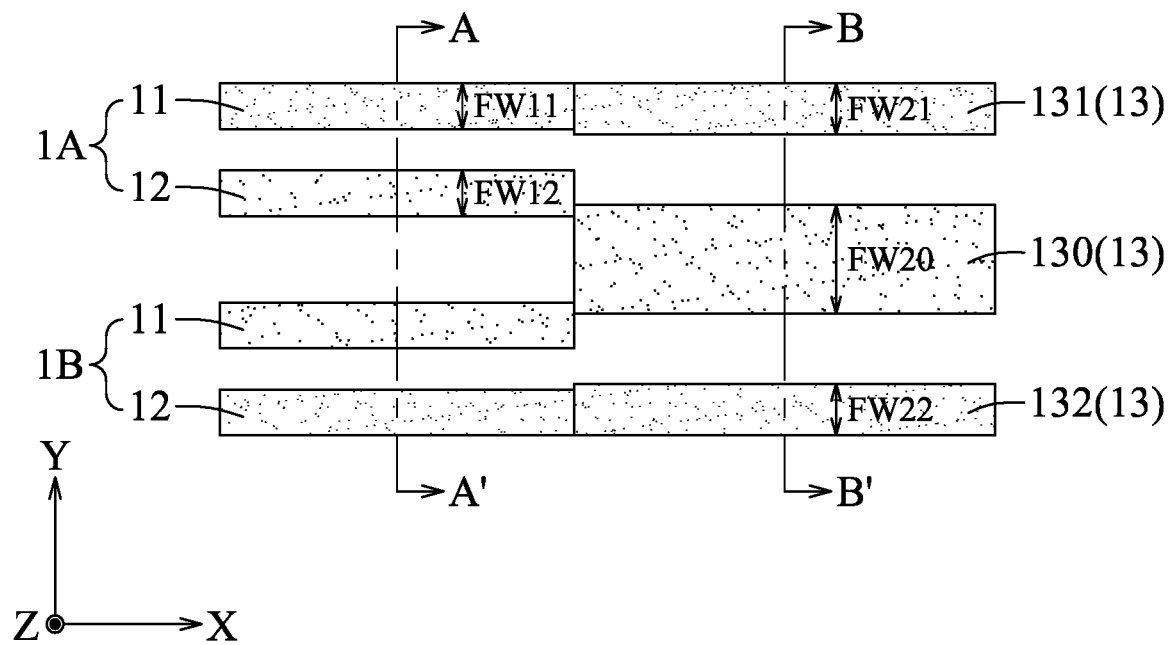
FIGS. 2 to 32 illustrate schematic views of intermediate stages of the method depicted in FIG. 1 in accordance with some embodiments.

Although critical dimension (CD) of transistors continues to shrink and various three-dimensional (3D) transistor structures (e.g., a gate-all-around (GAA) structure, a forksheet structure, etc.) are springing up for manufacturing integrated circuit (IC) with a high integration density, some transistors that are designed for high-speed computing require a channel having a relatively large channel width in a Y direction (see FIG. 2). In general, a forksheet-dominant device layout has an integration density that is greater than that of a GAA-dominant device layout due to a relatively smaller channel width in the Y direction. In a forksheet-dominant device layout in which any two of transistors are integrated by a forksheet structure, a dielectric wall is provided to be interposed between the two transistors for isolation. The two transistors and the dielectric wall have a total width in the Y direction with a certain value so as to permit the transistors to be periodically and densely arranged in the forksheet-dominant device layout. Since the dielectric wall has a minimum width in the Y direction, there is a physical limit when a channel of any one(s) of the two transistors is required to be enlarged in the Y direction for high-speed computing requirements. Therefore, the present disclosure provides a solution for integrating a GAA-dominant device layout into a forksheet-dominant device layout so as to integrate different operating units (e.g., memories, inverters, logic gates, flash, etc.) with different operational requirement (e.g., low power consumption, high-speed computing, etc.) in one IC. In the following, the present disclosure is directed to a semiconductor structure including a plurality of devices adjacent to each other and having various channel widths. The devices in the semiconductor structure may be independently configured as nanosheet gate-all-around field-effect transistors (GAA FETs), nanowire GAA FETs, complementary FETs (CFET), fork-sheet FETs, or other suitable configurations. The devices in the semiconductor structure may be integrated to function as memory cells, inverters, logic gates (e.g., NOR gates and NAND gates), or other suitable applications.

FIG. 1 is flow diagram illustrating a method 100 for manufacturing a semiconductor structure (for example, a semiconductor structure 90 shown in FIG. 30) in accordance with some embodiments. FIGS. 2 to 32 illustrate schematic views of intermediate stages of the method 100 in accordance with some embodiments. Some repeating structures are omitted in FIGS. 2 to 32 for the sake of brevity.

Figure 3:
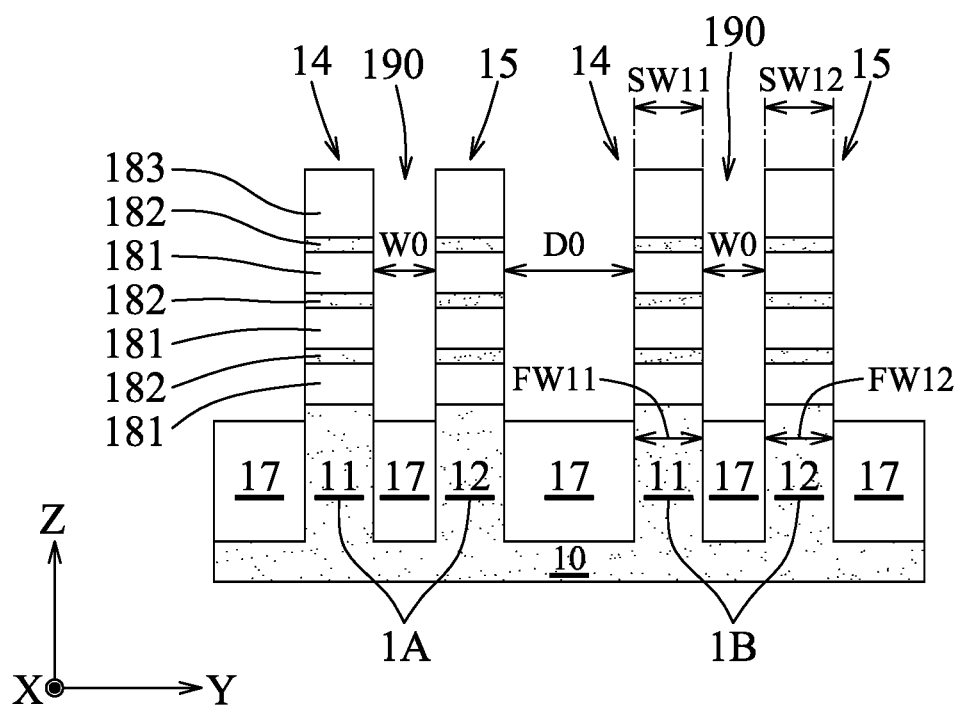
Figure 4:
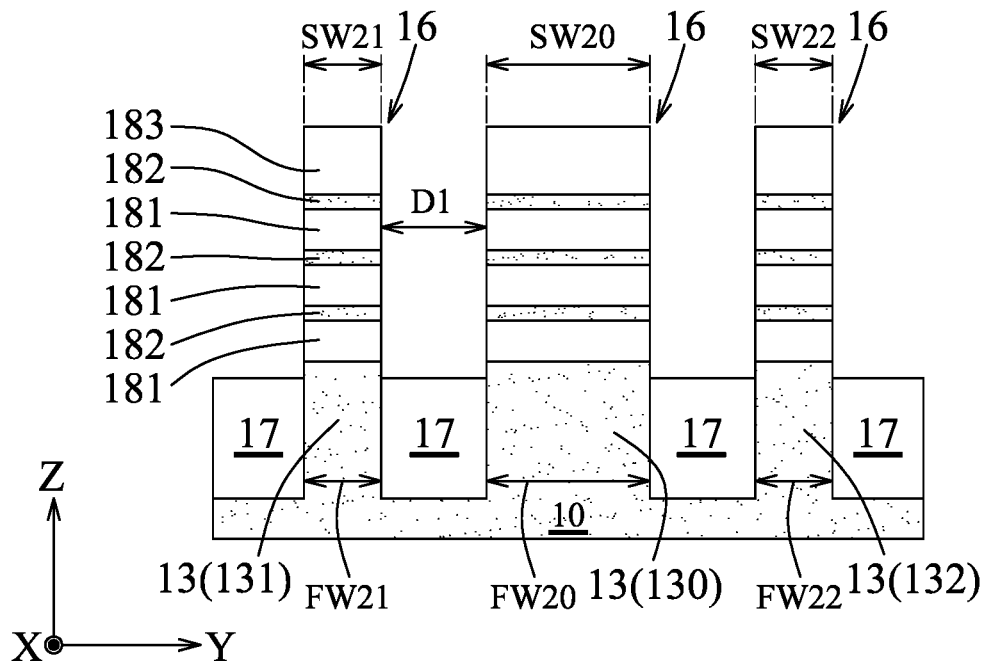

Referring to FIG. 1 and the examples illustrated in FIGS. 2, 3 and 4, the method 100 begins at step 101, where a patterned structure is formed. FIG. 2 is a top schematic view of the patterned structure in accordance with some embodiment, in which fins 11, 12, 13 are shown and other elements are omitted. FIGS. 3 and 4 are cross-sectional views respectively taken along lines A-A' and B-B' of FIG. 2 in accordance with some embodiments, but further illustrating the other elements omitted in FIG. 2.

The patterned structure includes a substrate 10, a plurality pairs of fins (each pair of which includes a first fin 11 and a second fin 12) disposed on the substrate 10, at least one third fin 13 disposed on the substrate 10, a plurality pairs of stacks (each pair of which includes a first stack 14 disposed on the first fin 11 of a corresponding pair of the fins, and a second stack 15 disposed on the second fin 12 of a corresponding pair of the fins), at least one third stack 16 disposed on the at least one third fin 13, and a plurality of isolation regions 17 disposed among the first, second, and third fins 11, 12, 13. In each pair of the fins 11, 12, the first and second fins 11, 12 are each elongated in an X direction transverse to the Y direction, and are spaced apart from each other in the Y direction. The at least one third fin 13 is elongated in the X direction and is in direct contact with at least one of the first and second fins 11, 12.

In some embodiments, as shown in FIG. 2, the patterned structure includes two pairs of the fins 11, 12 (i.e., a first pair 1A and a second pair 1B), two pairs of the stacks 14, 15, three of the third fins 13 (i.e., a main fin 130, a first auxiliary fin 131 and a second auxiliary fin 132) and three of the third stacks 16. The first and second auxiliary fins 131, 132 are located at opposite sides of the main fin 130 in the Y direction, and each of the first and second auxiliary fins 131, 132 is spaced apart from the main fin 130 in the Y direction. The second fin 12 of the first pair 1A is disposed to confront the first fin 11 of the second pair 1B in the Y direction. The main fin 130 is in direct contact with the second fin 12 of the first pair 1A and the first fin 11 of the second pair 1B. The first auxiliary fin 131 is in direct contact with the first fin 11 of the first pair 1A. The second auxiliary fin 132 is in direct contact with the second fin 12 of the second pair 1B.

Each of the fins 11, 12, 13 has a fin width in the Y direction. In some embodiments, at least one of the third fins 13 has a fin width (FW20, FW21, FW22) that is greater than a fin width (FW11, FW12) of each of the first and second fins 11, 12. In some embodiments, fin widths (FW20, FW21, FW22) of the third fins 13 may be different from each other. For example, the main fin 130 may have a fin width (FW20) that is greater than a fin width (FW21, FW22) of each of the first and second auxiliary fins 131, 132. In some embodiments, in each pair of the fins 11, 12, the first fin 11 may have a fin width (FW11) the same as a fin width (FW12) of the second fin 12. In some other embodiments, in each pair of the fins 11, 12, the first fin 11 may have a fin width (FW11) different from a fin width (FW12) of the second fin 12, as shown in FIG. 2.

In some embodiments, as shown in FIGS. 3 and 4, each of the stacks 14, 15, 16 has a stack width (SW11, SW12, SW20, SW21, SW22) in the Y direction substantially equal to a fin width of a corresponding one of the fins 11, 12, 13 disposed therebeneath. The stack widths (SW11, SW12, SW20, SW21, SW22) of the stacks 14, 15, 16, which are adjustable and determined in step 101, will respectively affect channel widths (CW11, CW12, CW20, CW21, CW22) in the Y direction of channel features 182A (see FIGS. 13 and 14) to be subsequently formed.

Figure 5:
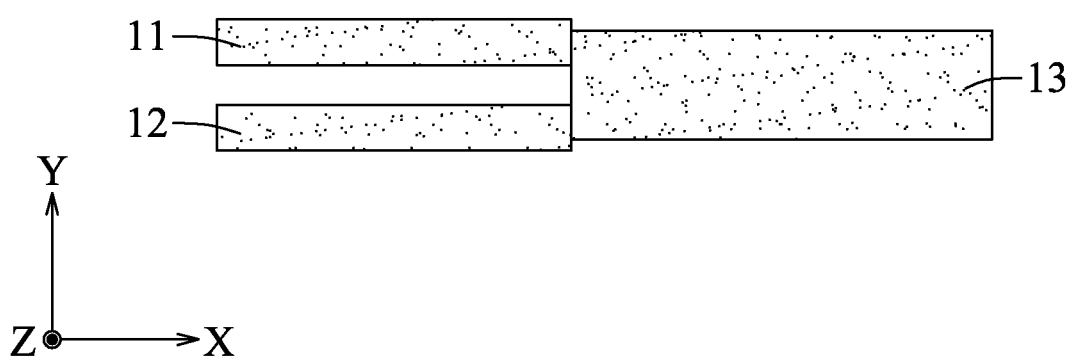

FIG. 5 is a view similar to that of FIG. 2 but illustrating a different relationship among the first, second and third fins 11, 12, 13 in accordance with some other embodiments. As shown in FIG. 5, the patterned structure includes a single pair of the fins (i.e., the first fin 11 and the second fin 12) and a single third fin 13 in direct contact with both the first and second fins 12.

In some embodiments, the substrate 10 may be made of elemental semiconductor materials, such as crystalline silicon (Si), diamond, or germanium (Ge); compound semiconductor materials, such as gallium nitride (GaN), silicon carbide (SiC), gallium arsenide (GaAs), indium arsenide (InAs), or indium phosphide (InP); or alloy semiconductor materials, such as silicon germanium (SiGe), silicon germanium carbide, gallium arsenic phosphide (GaAsP), or gallium indium phosphide (GaInP). The material for forming the substrate 10 may be doped with p-type impurities or n-type impurities, or undoped. In addition, the substrate 10 may be a bulk silicon substrate, a silicon-on-insulator (SOI) substrate, or a germanium-on-insulator (GOI) substrate. Other suitable materials and/or configurations for the substrate 10 are within the contemplated scope of the present disclosure.

Each of the fins 11, 12, 13 may be independently made of a material the same as or different from that of the substrate 10 as described above. The material for forming the fins 11, 12, 13 may be doped with p-type impurities or n-type impurities, or undoped. In some embodiments, when one of the fins 11, 12, 13 is designed for forming an n-FET thereon, the one of the fins 11, 12, 13 may be doped with p-type impurities; and when one of the fins 11, 12, 13 is designed for forming a p-FET thereon, the one of the fins 11, 12, 13 may be doped with n-type impurities so as to reduce a substrate leakage current.

Each of the stacks 14, 15, 16 includes a plurality of sacrificial layers 181 and a plurality of channel layers 182 disposed to alternate with the sacrificial layers 181 in a Z direction transverse to both the X and Y directions. In some embodiments, the X, Y, and Z directions are perpendicular to one another. In some embodiments, an uppermost one of the channel layers 182 is disposed over an uppermost one of the sacrificial layers 181. The number of the sacrificial layers 181 and the channel layers 182 in each of the first, second and third stacks 14, 15, 16 are determined according to application requirements. In some embodiments, each of the stacks 14, 15, 16 further includes a mask layer 183 disposed on the uppermost one of the channel layers 182. In FIGS. 3 and 4, in each of the stacks 14, 15, 16, the number of each of the sacrificial layers 181 and the channel layers 182 is three. Although FIGS. 3 and 4 show that the thickness of each of the sacrificial layers 181 is greater than that of each of the channel layers 182, the thickness of each of the sacrificial layers 181 may be equal to or smaller than that of each of the channel layers 182 according to practical requirements.

Suitable materials for the sacrificial layers 181 and the channel layers 182 are similar to those for the substrate 10, but the material of the sacrificial layers 181 is different from that of the channel layers 182, so that the sacrificial layers 181 can be selectively removed with respect to the material of the channel layers 182 during subsequent processes. In some embodiments, each of the channel layers 182 is made of Si, and each of the sacrificial layers 181 is made of SiGe. Other suitable materials for the sacrificial layers 181 and the channel layers 182 are within the contemplated scope of the present disclosure. The mask layer 183 may include a low dielectric constant (low-k) material (such as silicon oxide, silicon nitride, silicon oxynitride, silicon carbonitride, silicon oxycarbide, silicon oxycarbonitride, silicon carbide, and so on), a high dielectric constant (high-k) material (such as hafnium oxide, zirconium oxide, zirconium aluminum oxide, hafnium aluminum oxide, hafnium silicon oxide, aluminum oxide, and so on), or a combination thereof. Other suitable materials for the mask layer 183 are within the contemplated scope of the present disclosure.

In some embodiments, each of the isolation regions 17 may be a portion of a shallow trench isolation (STI), a deep trench isolation (DTI), or other suitable structures. The isolation regions 17 may include a suitable low-k material (such as the examples described in the preceding paragraph). Other suitable materials and/or configurations for the isolation regions 17 are within the contemplated scope of the present disclosure.

In some embodiments, the patterned structure may be formed by (i) patterning a semiconductor substrate and a stack unit (not shown) formed thereon to form the fins 11, 12, 13 on the substrate 10 and the stacks 14, 15, 16 respectively on the fins 11, 12, 13 (the semiconductor substrate is patterned into the substrate 10 and the fins 11, 12, 13, and the stack unit is patterned into the stacks 14, 15, 16), (ii) forming an isolation layer to cover the substrate 10 and the stacks 14, 15, 16, followed by a planarization process, for example, but not limited to, chemical mechanism polishing (CMP), to form isolation portions among the stacks 14, 15, 16, and (iii) recessing the isolation portions to form the isolation regions 17 by dry etching so as to expose the stacks 14, 15, 16. Other suitable processes for forming the patterned structure are within the contemplated scope of the present disclosure.

Figure 8:
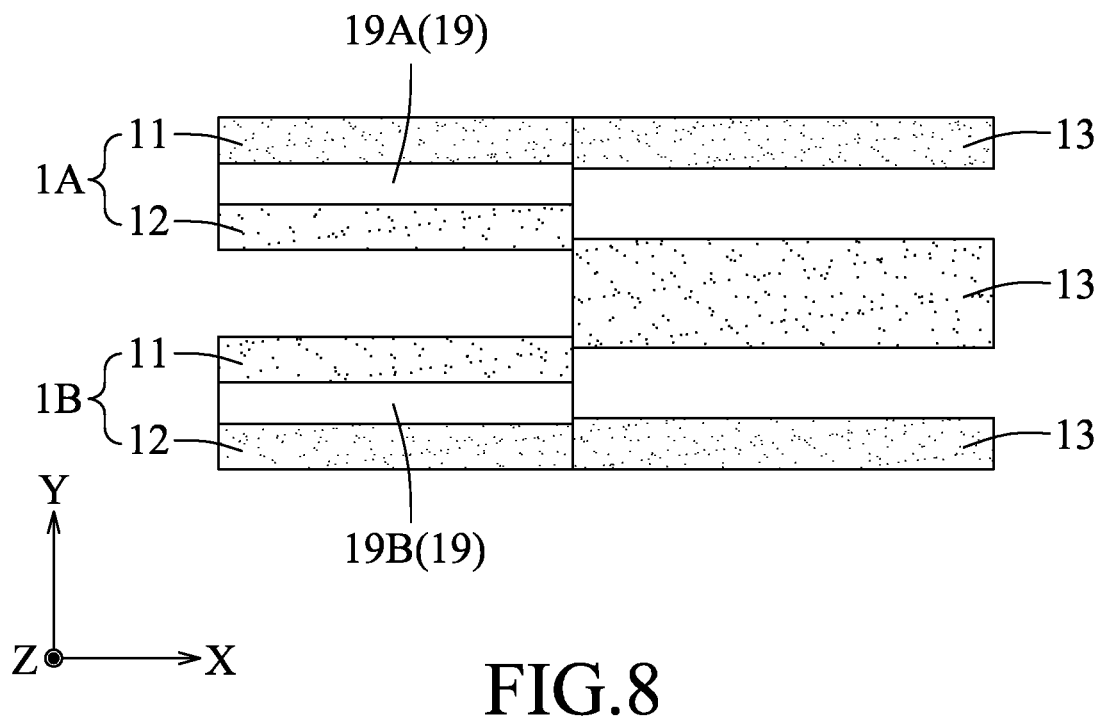
Figure 9:
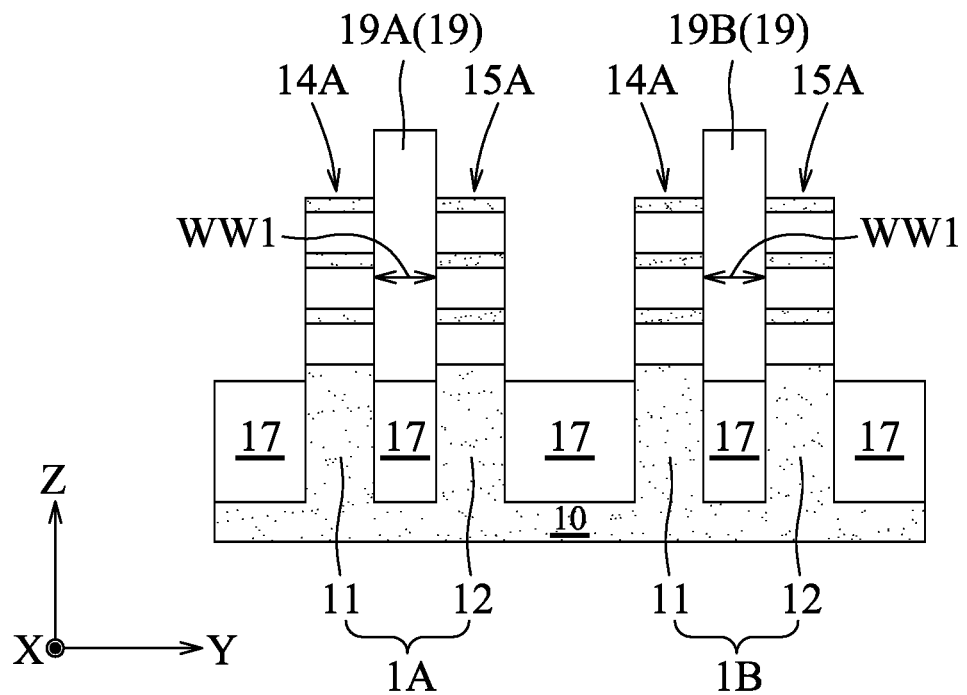
Figure 10:
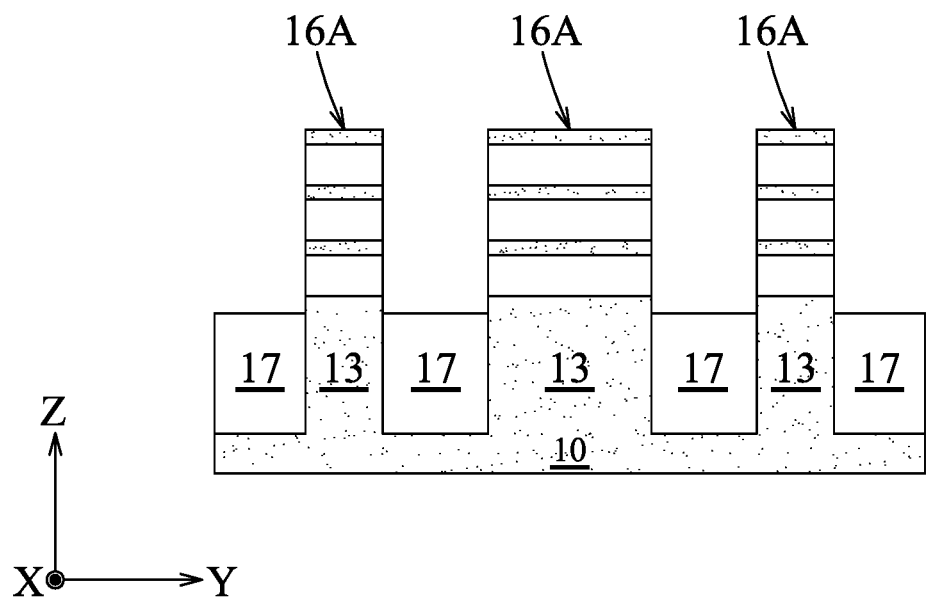

Referring to FIG. 1 and the examples illustrated in FIGS. 8, 9, and 10, the method 100 proceeds to step 102, where a plurality of dielectric walls 19 are each formed between a corresponding pair of the first and second stacks 14, 15. FIG. 8 is a schematic view similar to FIG. 2 but further illustrating the dielectric walls 19. FIGS. 8 to 10 are views respectively similar to FIGS. 2 to 4, but illustrating the structures after step 102.

In some other not shown embodiments, a lower end of each of the dielectric walls 19 shown in FIG. 9 may further extend downwardly to be in contact with the substrate 10 such that each of the dielectric walls 19 may be formed between a corresponding pair of the first and second fins 11, 12. In some embodiments, each of the dielectric walls 19 may be formed as a single layer structure or a multi-layered structure. In some embodiments, the dielectric walls 19 may include a suitable low-k material and/or a high-k material (such as the examples described in the preceding paragraph). Other suitable materials for the dielectric walls 19 are within the contemplated scope of the present disclosure.

In some embodiments, step 102 may include sub-steps 1021 and 1022.

Figure 6:
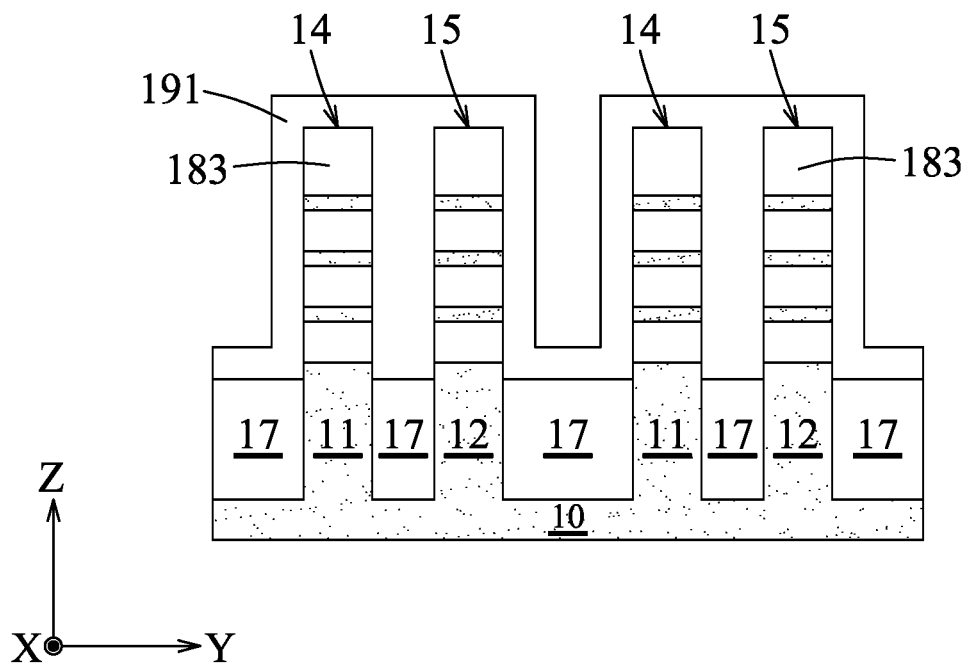
Figure 7:
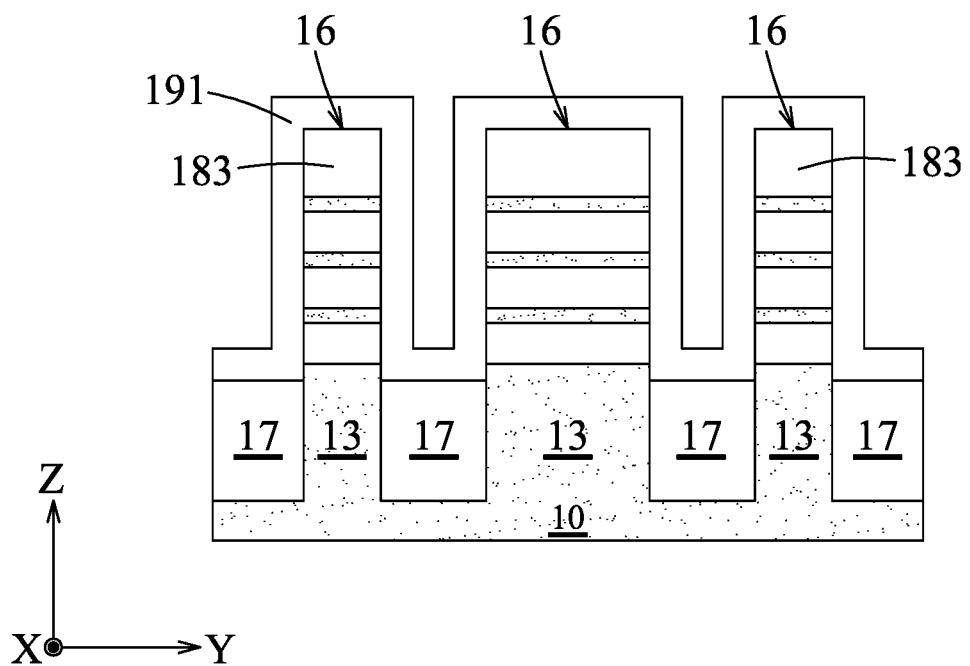

In sub-step 1021, as shown in FIGS. 6 and 7, a dielectric material layer 191 for forming the dielectric walls 19 is formed over the structure obtained after step 101 by, for example, physical vapor deposition (PVD), chemical vapor deposition (CVD), atomic layer deposition (ALD), molecular-beam deposition (MBD), or other suitable processes so as to fill a gap 190 between each pair of the first and second stacks 14, 15 (see FIGS. 2 and 3).

In sub-step 1022, the dielectric material layer 191 is etched back using a wet etching process, other suitable process, or combinations thereof, to remain portions of the dielectric layer 191 between each pair of the stacks 14, 15 (see FIG. 6) so as to obtain the dielectric walls 19. In some embodiments, as shown in FIGS. 8 and 9, a first dielectric wall 19A is formed between a pair of the first and second stacks 14, 15 which is disposed on the first and second fins 11, 12 of the first pair 1A, and a second dielectric wall 19B is formed between the other pair of the first and second stacks 14, 15 which is disposed on the first and second fins 11, 12 of the second pair 1B.

In some embodiments, the gap 190 (see FIG. 3) between each pair of the stacks 14, 15 has a gap width (W0) ranging from about 10 nm to about 40 nm, and the gap width (W0) may determine a wall width (WW1) of each of the dielectric walls 19 which is formed between a corresponding pair of the stacks 14, 15. In some embodiments, the wall width (WW1) may range from about 10 nm to about 40 nm.

In some embodiments, as shown in FIGS. 3 and 4, two adjacent pairs of the stacks 14, 15 are spaced apart in the Y direction by a distance (D0) not less than about 40 nm, and two adjacent ones of the third stacks 16 are spaced apart in the Y direction by a distance (D1) not less than about 40 nm, such that during etching back of the dielectric material layer 191, portions of the dielectric material layer 191 between the two adjacent pairs of the stacks 14, 15 and between the two adjacent ones of the third stacks 16 may be removed.

In some embodiments, during etching back of the dielectric material layer 191, the mask layers 183 of the first, second and third stacks 14, 15, 16 shown in FIGS. 6 and 7 are also removed. In this case, an etchant which has an etching selectivity to the material of the mask layers 183 higher than an etching selectivity to the materials of other elements may be used, and the dielectric material of the mask layers 183 may be different from the dielectric materials of the dielectric material layer 191 and the isolation regions 17. Other suitable processes for forming the dielectric walls 19 are within the contemplated scope of the present disclosure. After step 102, the remaining portions of the first, second and third stacks 14, 15, 16 are denoted by 14A, 15A and 16A, respectively.

Figure 11:
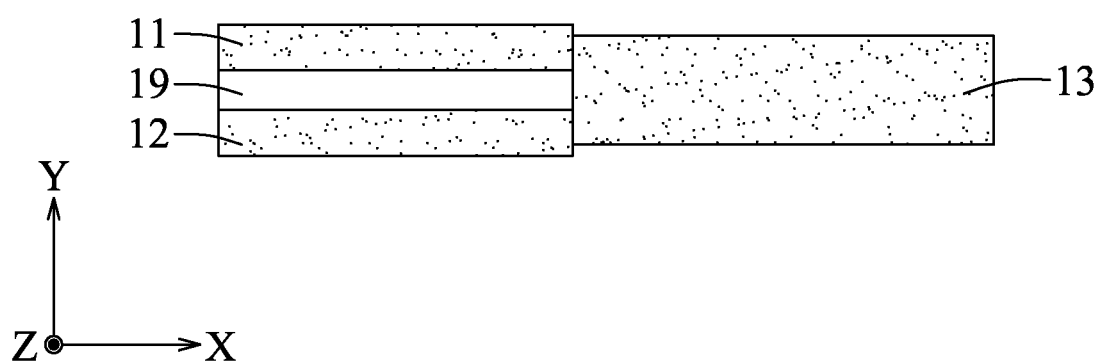

FIG. 11 is similar to FIG. 5 but illustrating the structure after step 102 in accordance with some other embodiments. It can be seen that a single dielectric wall 19 is formed among the fins 11, 12, 13.

Since the semiconductor structure made by the method 100 may have a plurality of layout designs based on application requirements, in the following steps, the structures shown in FIGS. 8 to 10 are to be further illustrated, and the structures shown in FIG. 11 will not be further illustrated for the sake of brevity.

Figure 12:
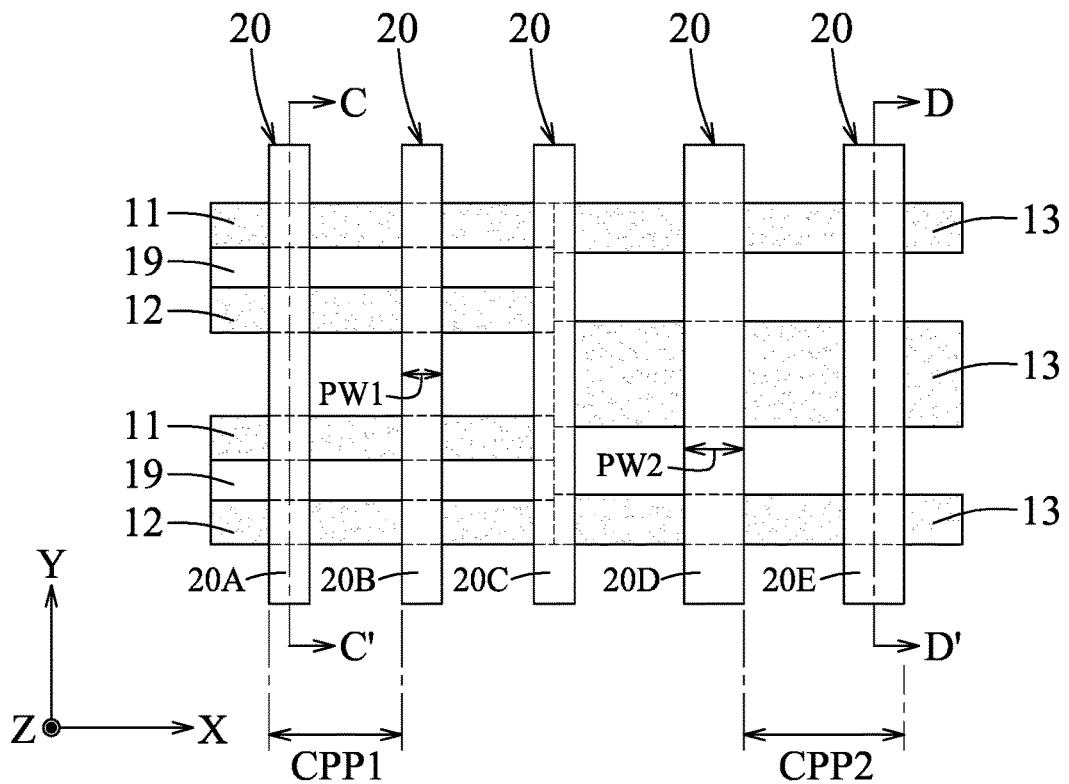
Figure 13:
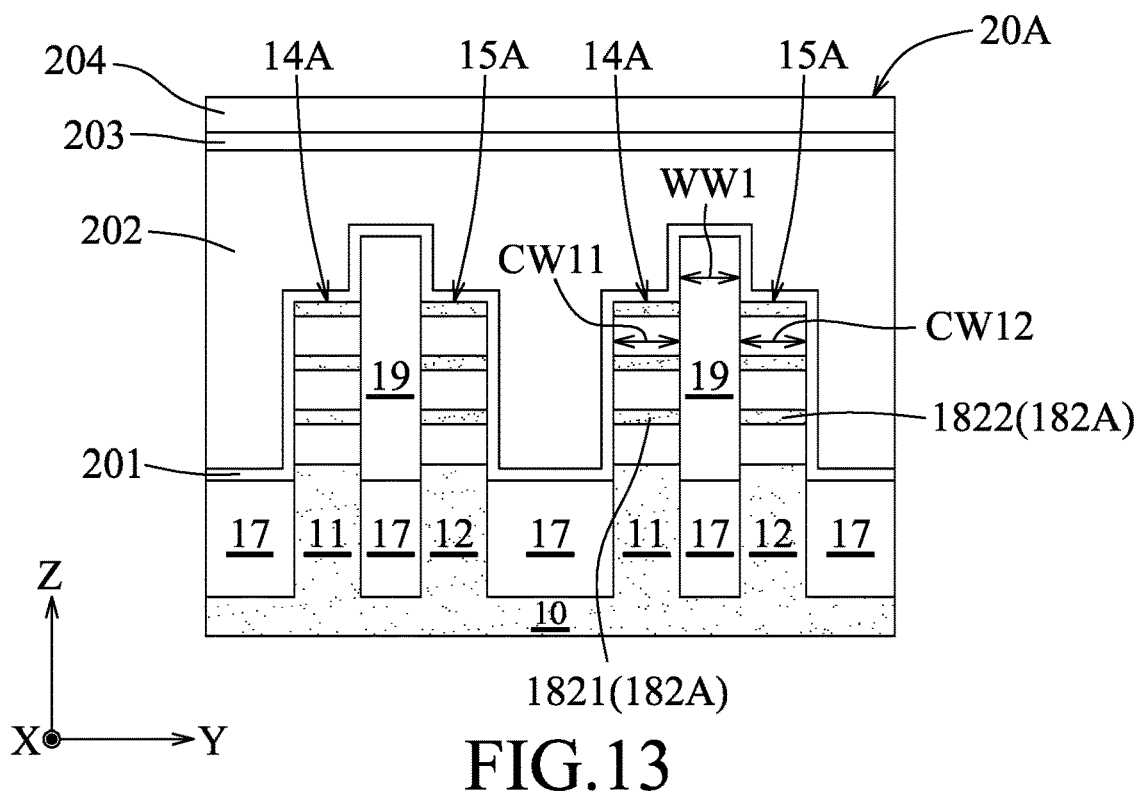
Figure 14:
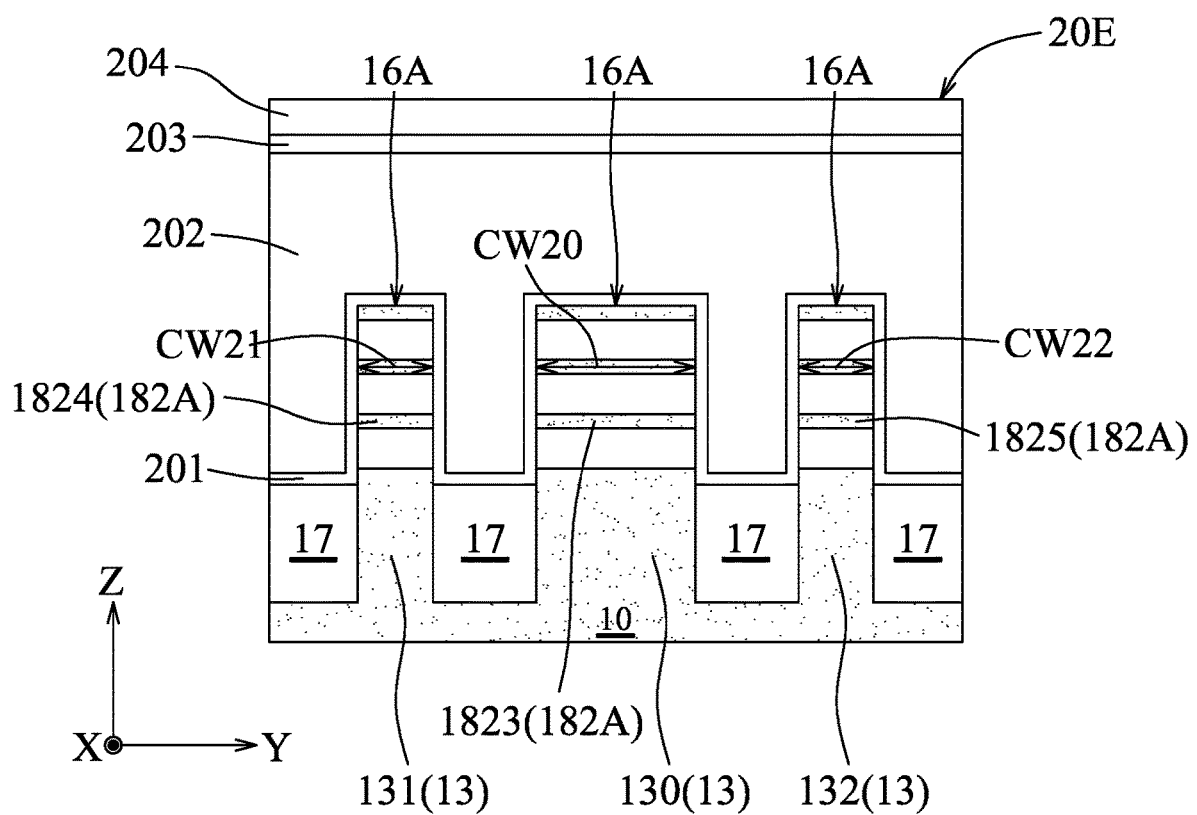

Referring to FIG. 1 and the examples illustrated in FIGS. 12, 13, and 14, the method 100 proceeds to step 103, where a plurality of dummy gate portions 20 are formed over the structure obtained after step 102. FIG. 12 is a schematic view similar to FIG. 8 but further illustrating the dummy gate portions 20. FIGS. 12 to 14 are views respectively similar to FIGS. 8 to 10, but illustrating the structures after step 103. FIGS. 13 and 14 are cross-sectional views respectively taken along lines C-C' and D-D' of FIG. 12 in accordance with some embodiments but further illustrating the other elements omitted in FIG. 12. The dummy gate portions 20 are each elongated in the Y direction, and are spaced apart from each other in the X direction.

For the purposes of simplicity and clarity, in FIG. 12, the number of the dummy gate portions 20 is five. For better illustration, as shown in FIGS. 12 to 14, (i) the dummy gate portions, which are disposed over the first and second fins 11, 12, the first and second stacks 14, 15 and the dielectric walls 19, are denoted by 20A, 20B, (ii) the dummy gate portion, which is disposed to over the first, second and third fins 11, 12, 13 and the first, second and third stacks 14, 15, 16, is denoted by 20C, and (iii) the dummy gate portions, which are disposed over the third fins 13 and the third stacks 16A, are denoted by 20D, 20E. In practical, the number of the dummy gate portions 20 are determined according to application requirements.

Each of the dummy gate portions 20 has a poly width in the X direction. The poly width of each of the dummy gate portions 20 will affect a gate width (GW1, GW2) in the X direction of a corresponding one of gate structures 30 (see FIG. 20) to be subsequently formed, and is positively correlated with a channel length (CL11, CL12, CL2) in the X direction of the channel features 182A (see FIG. 16).

In some embodiments, each of the dummy gate portions 20D, 20E may have a second poly width (PW2) that is greater than a first poly width (PW1) of each of the dummy gate portions 20A, 20B, 20C. In some embodiments, a ratio of the second poly width (PW2) to the first poly width (PW1) may range from about 1.1 to about 1.5.

Each of the dummy gate portions 20A, 20B has a side surface which is distal from the dummy gate portion 20C, and the side surfaces of two adjacent ones of the dummy gate portions 20A, 20B are spaced apart by a first pitch (CPP1). Each of the dummy gate portions 20D, 20E has a side surface which is distal from the dummy gate portion 20C, and the side surfaces of two adjacent ones of the dummy gate portions 20D, 20E are spaced apart by a second pitch (CPP2). The first and second pitches (CPP1, CPP2), which are adjustable and determined in step 103, will affect periodicity of distribution of the gate structures 30 (see FIG. 20) to be subsequently formed. In some embodiments, the first pitch (CPP1) may be the same as the second pitch (CPP2). In some other embodiments, as shown in FIG. 12, the second pitch (CPP2) is greater than the first pitch (CPP1). In some embodiments, the second pitch (CPP2) may be greater than the first pitch (CPP1) by about 5% to about 20%. That is, a ratio of the second pitch (CPP2) to the first pitch (CPP1) may range from about 1.05 to about 1.2.

In some embodiments, each of the dummy gate portions 20 may include, in a direction away from the substrate 10, a dummy gate dielectric 201, a dummy gate electrode 202, a polish stop layer 203, and a hard mask 204. In some embodiments, each of the hard mask 434 and the polish stop layer 433 may independently include silicon nitride, silicon oxide, silicon oxynitride, or combinations thereof; the dummy gate electrode 432 may include polycrystalline silicon, single crystalline silicon, amorphous silicon, or combinations thereof; and the dummy gate dielectric 431 may include silicon oxide, silicon nitride, silicon oxynitride, a suitable high-k material (such as the examples described in the preceding paragraph), or combinations thereof. In some embodiments, step 103 for forming the dummy gate portions 20 may include (i) sequentially depositing two layers of materials for forming the dummy gate dielectric 201 and the dummy gate electrode 202 over the structure obtained after step 102 using PVD, CVD, ALD or other suitable processes, (ii) performing a planarization process using, for example, CMP to form a planar surface, (iii) sequentially depositing another two layers of materials for forming the polish stop layer 203 and the hard mask 204 using PVD, CVD, ALD or other suitable processes, and (iv) patterning the four layers of materials through a patterned photoresist layer using a suitable etching process (such as a dry etching process, a wet etching process, other suitable processes, or combinations thereof). Other suitable materials and/or processes for forming the dummy gate portions 20 are within the contemplated scope of the present disclosure.

Figure 15:
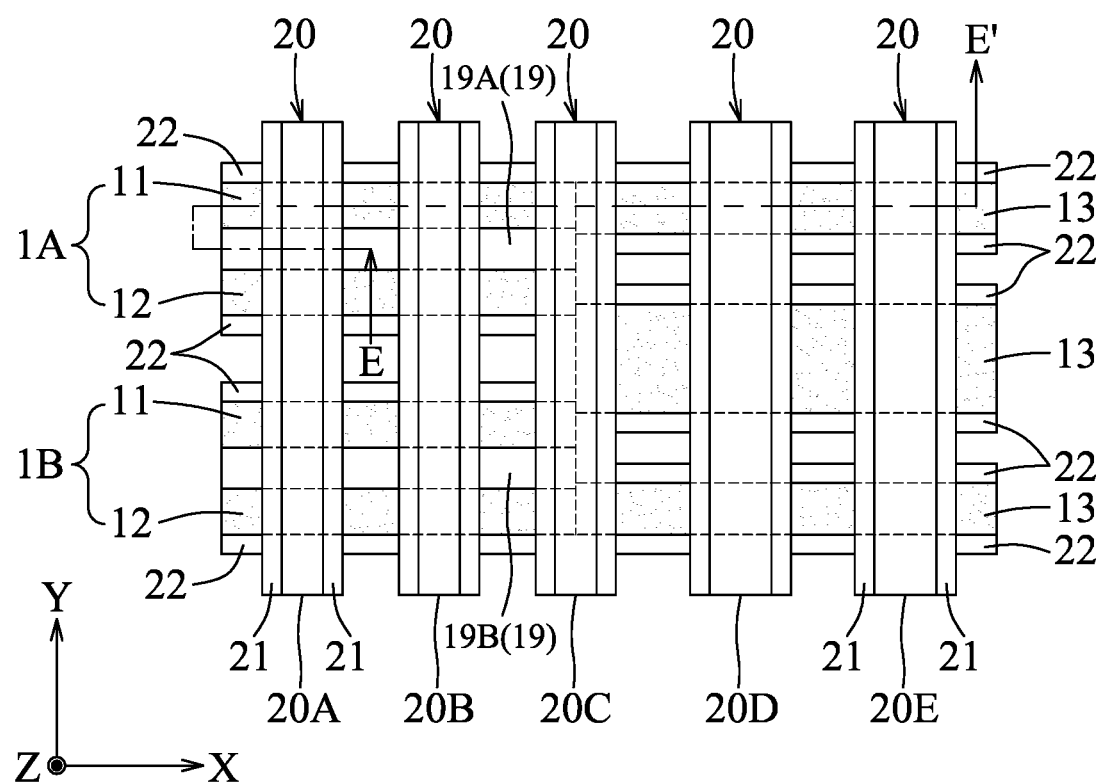
Figure 16:
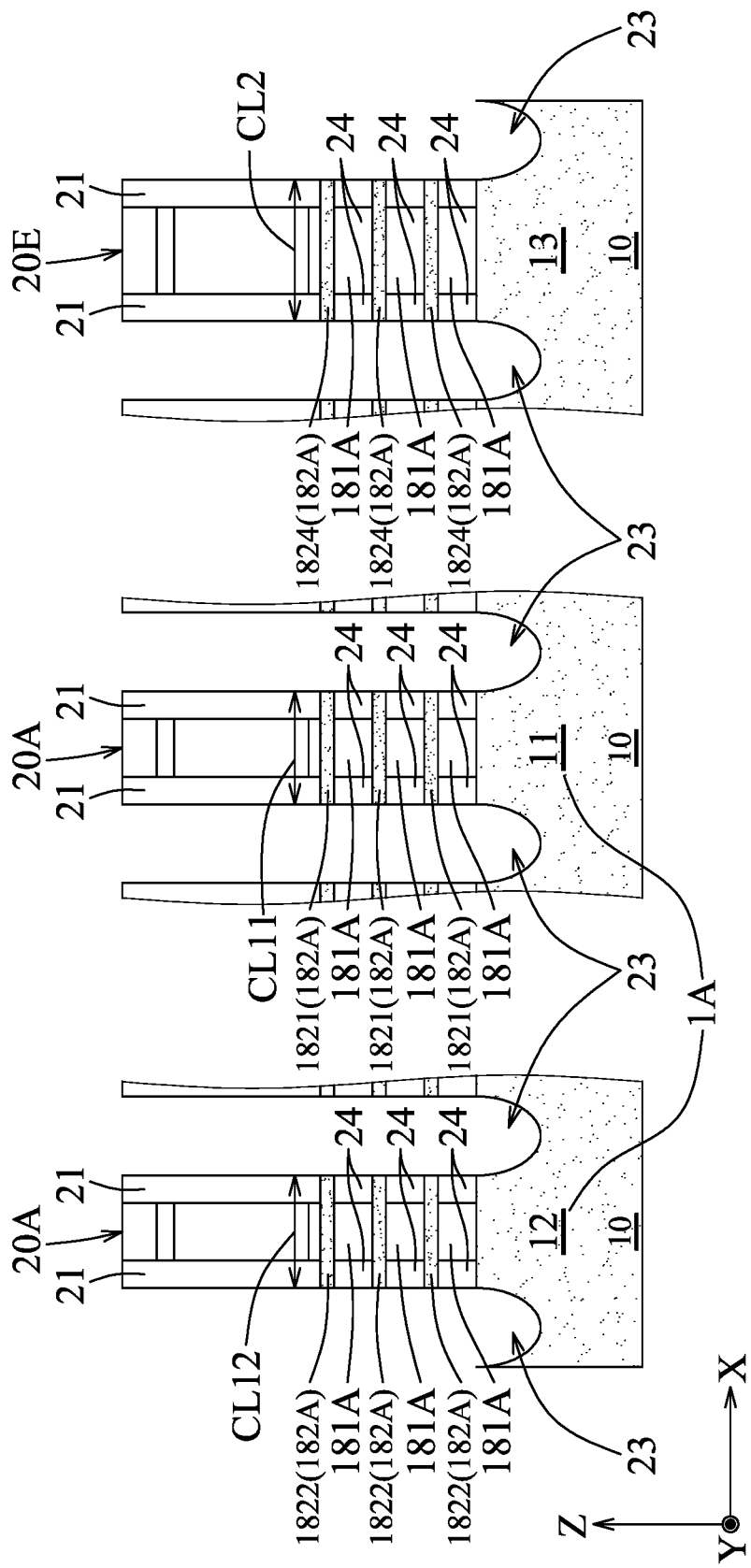

Referring to FIG. 1 and the examples illustrated in FIGS. 13 to 16, the method 100 proceeds to step 104, where a plurality of gate spacers 21, a plurality of fin sidewalls 22, a plurality of source/drain recesses 23 and a plurality of inner spacers 24 are formed. FIG. 15 is similar to FIG. 12 but further illustrating the gate spacers 21 and the fin sidewalls 22 in accordance with some embodiments. FIG. 16 is a cross-sectional view taken along line E-E' of FIG. 15 in accordance with some embodiments but further illustrating the other elements omitted in FIG. 15. For the purposes of simplicity and clarity, the dummy gate portions 20A, 20E and corresponding elements adjacent thereto are shown in FIG. 16, and other elements not adjacent thereto are omitted. The structures shown in FIGS. 13 and 14 are substantially not changed after step 104.

In some embodiments, step 104 includes sub-steps 1041 to 1044.

In sub-step 1041, each pair of the gate spacers 21 are respectively formed at the two opposite sides of a corresponding one of the dummy gate portions 20 in the X direction. In some embodiments, each of the gate spacers 21 may be formed as a single layer structure or a multi-layered structure. In some embodiments, the gate spacers 21 may be formed by conformally depositing dielectric material(s) for forming the gate spacers 21 over the structure obtained after step 103 using, for example, CVD, ALD, or other suitable deposition techniques, followed by an anisotropic dry etching process until an upper surface of each of the dummy gate portions 20 is exposed such that the remaining dielectric material(s) serve as the gate spacers 21.

In some embodiments, referring to FIGS. 13 to 15, a first fin unit, a second fin unit, and three fin assemblies are obtained after sub-step 1041. The first fin unit includes the first and second fins 11, 12 of the first pair 1A, a corresponding pair of the stacks 14A, 15A disposed on the first and second fins 11, 12 of the first pair 1A, and the first dielectric wall 19A, and has a plurality of exposed portions exposed from the dummy gate portions 20 and the gate spacers 21. The second fin unit includes the first and second fins 11, 12 of the second pair 1B, a corresponding pair of the stacks 14A, 15A disposed on the first and second fins 11, 12 of the second pair 1B, and the second dielectric wall 19B, and has a plurality of exposed portions exposed from the dummy gate portions 20 and the gate spacers 21. Each of the three fin assemblies includes one of the third fins 13 and a corresponding one of the third stacks 16A disposed thereon, and has a plurality of exposed portions exposed from the dummy gate portions 20 and the gate spacers 21. In some embodiments, during formation of the gate spacers 21, a plurality pairs of the fin sidewalls 22 are formed. Each pair of the fin sidewalls 22 is formed at two opposite sides of a corresponding one of the first fin unit, the second fin unit and the three fin assemblies in the Y direction. Each of the fin sidewalls 22 has a plurality of sidewall segments which are disposed aside corresponding ones of the exposed portions. In some embodiments, the dielectric materials for forming the gate spacers 21 and the fin sidewalls 22 may include a suitable low-k material (such as the examples described in the preceding paragraph), but is not limited thereto. Other suitable materials for the gate spacers 21 and the fin sidewalls 22 are within the contemplated scope of the present disclosure.

In sub-step 1042, the exposed portions of the first and second fin units and the three fin assemblies are respectively etched away to form a plurality of source/drain recesses 23 using dry etching, wet etching, other suitable processes, or combinations thereof. After sub-step 1042, the sacrificial layers 181 and the channel layers 182 (see FIGS. 3 and 4) are respectively patterned into sacrificial features (not shown) and the channel features 182A (see FIG. 16).

As shown in FIG. 16, after sub-step 1042, the channel layers 182 of the first remaining stacks 14A shown in FIG. 9 are patterned into first channel features 1821, each of which has a channel length (CL11) in the X direction, and the channel layers 182 of the second remaining stacks 15A shown in FIG. 9 are patterned into second channel features 1822, each of which has a channel length (CL12) in the X direction. The channel layers 182 of the third remaining stack 16A disposed on the main fin 130 are patterned into third channel features 1823 (see FIG. 14), the channel layers 182 of the third remaining stack 16A disposed on the first auxiliary fin 131 are patterned into fourth channel features 1824 (see FIGS. 14 and 16), and the channel layers 182 of the third remaining stack 16A disposed on the second auxiliary fin 131 are patterned into fifth channel features 1825 (see FIG. 14). Each of the channel features 1823, 1824, 1825 has a channel length (CL2) in the X direction. In some embodiments, the channel length (CL2) of each of the channel features 1823, 1824, 1825 is greater than the channel length (CL11, CL12) of each of the first and second channel features 1821, 1822.

As shown in FIGS. 13 and 14, each of the channel features 1821, 1822, 1823, 1824, 1825 has a channel width (CW11, CW12, CW20, CW21, CW22) in the Y direction. In some embodiments, as shown in FIG. 13, each of the first channel features 1821 may have a channel width (CW11) the same as a channel width (CW12) of each of the second channel features 1822. In some other embodiments, each of the first channel features 1821 may have a channel width (CW11) different from a channel width (CW12) of each of the second channel features 1822. In some embodiments, a ratio of the wall width (WW1) of one of the dielectric walls 19 to a channel width (CW11, CW12) of each of the channel features 1821, 1822 disposed adjacent to the one of the dielectric walls 19 may independently range from about 0.2 to about 3.

In some embodiments, at least one stack of the channel features 1823, 1824, 1825 has a channel width (CW20, CW21, CW22) that is greater than a channel width (CW11, CW12) of each of the channel features 1821, 1822.

In some embodiments, when each of the first channel features 1821 has a channel width (CW11) different from a channel width (CW12) of each of the second channel features 1822, a ratio of the channel width (CW11, CW12) of each of the channel features 1821, 1822 to the channel width (CW20, CW21, CW22) of the at least one stack of the channel features 1823, 1824, 1825 may independently range from about 0.2 to about 0.9.

In some embodiments, when each of the first channel features 1821 has a channel width (CW11) the same as channel width (CW12) of each of the second channel features 1822, a ratio of the channel width (CW11, CW12) of each of the channel features 1821, 1822 to the channel width (CW20, CW21, CW22) of the at least one stack of the channel features 1823, 1824, 1825 may independently range from about 0.2 to about 0.5.

In some embodiments, a sum of the channel width (CW11), the channel width (CW12) and the wall width (WW1) may be smaller than, equal to, or greater than the channel width (CW20).

In some embodiments, each of the first channel features 1821 has a channel width (CW11) ranging from about 5 nm to about 60 nm. In some embodiments, each of the second channel features 1822 has a channel width (CW12) ranging from about 5 nm to about 60 nm. In some embodiments, at least one stack of the channel features 1823, 1824, 1825 has a channel width (CW20, CW21, CW22) ranging from about 6 nm to about 120 nm.

In some embodiments, each of the channel features 182A disposed on one of the third fins 13 may have a channel width the same as or different from that of each of the channel features 182A disposed on another one of the third fins 13. For example, as shown in FIG. 14, the third channel features 1823 have a channel width (CW20) that is greater than a channel width (CW21, CW22) of each of the fourth and fifth channel features 1824, 1825.

In some embodiments, in the case that the first channel features 1821 disposed on the first fin 11 of the first pair 1A is designed for forming an n-FET, and that the second channel features 1822 disposed on the second fin 12 of the first pair 1A is designed for forming a p-FET, the first channel features 1821 may each have an N1-channel width in the Y direction, and the second channel features 1822 may each have a P2-channel width in the Y direction. A ratio of the N1-channel width to the P2-channel width may range from about 0.4 to about 2.5. In some embodiments, in the case that the third channel features 1823 is designed for forming an n-FET, and that the fourth channel features 1824 is designed for forming a p-FET, the third channel features 1823 may each have an N3-channel width in the Y direction, and the fourth channel features 1824 may each have a P4-channel width in the Y direction. A ratio of the N3-channel width to the P4-channel width may range from about 0.4 to about 2.5.

In some embodiments, as shown in FIG. 16, each of the source/drain recesses 23 extends into an upper part of a corresponding one of the fins 11, 12, 13. In some embodiments, the fin sidewalls 22 are recessed during formation of the source/drain recesses 23, and thus have a reduced height compared to the height of the fin sidewalls 22 obtained in sub-step 1041.

In sub-step 1043, the sacrificial features are recessed through the source/drain recesses 23 to form lateral recesses (not shown) by an isotropic etching process, such as wet etching, or other suitable etching techniques. After sub-step 1043, the remaining sacrificial features are denoted by 181A (see FIG. 16).

In sub-step 1044, referring to FIG. 16, the inner spacers 24 are formed to respectively cover two opposite ends of the remaining sacrificial features 181A in the X direction. In some embodiments, the inner spacers 24 may be formed by (i) depositing a dielectric material (not shown) for forming the inner spacers 24 on the structure obtained after sub-step 1043 to fill the lateral recesses by CVD, ALD, or other suitable deposition techniques, and (ii) removing excess portions of the dielectric material for forming the inner spacers 24 by an etching process, for example, but not limited to, a wet etching process, a dry etching process, other suitable etching techniques, or combinations thereof, such that the inner spacers 24 are respectively formed in the lateral recesses. In some embodiments, the dielectric material for forming the inner spacers 24 includes silicon oxide, silicon nitride, silicon oxynitride, other suitable dielectric materials, or combinations thereof. Other dielectric materials suitable for the inner spacers 24 are within the contemplated scope of the present disclosure.

Figure 17:
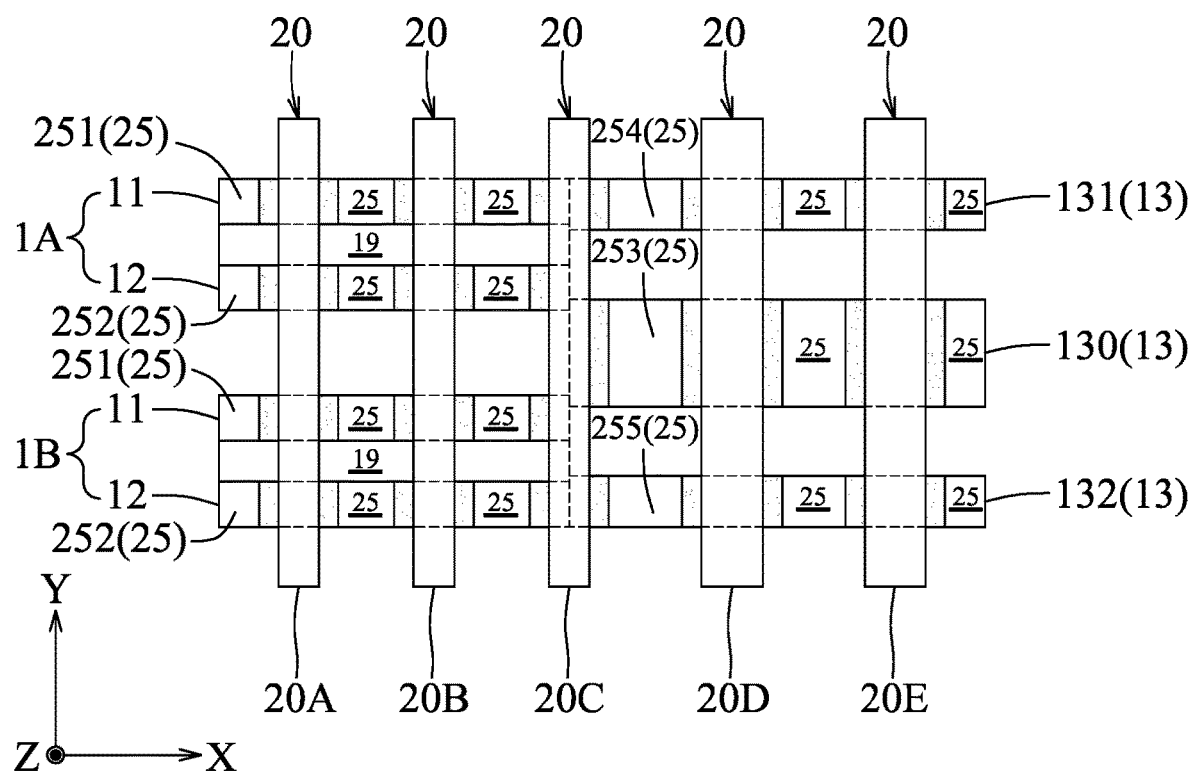
Figure 18:
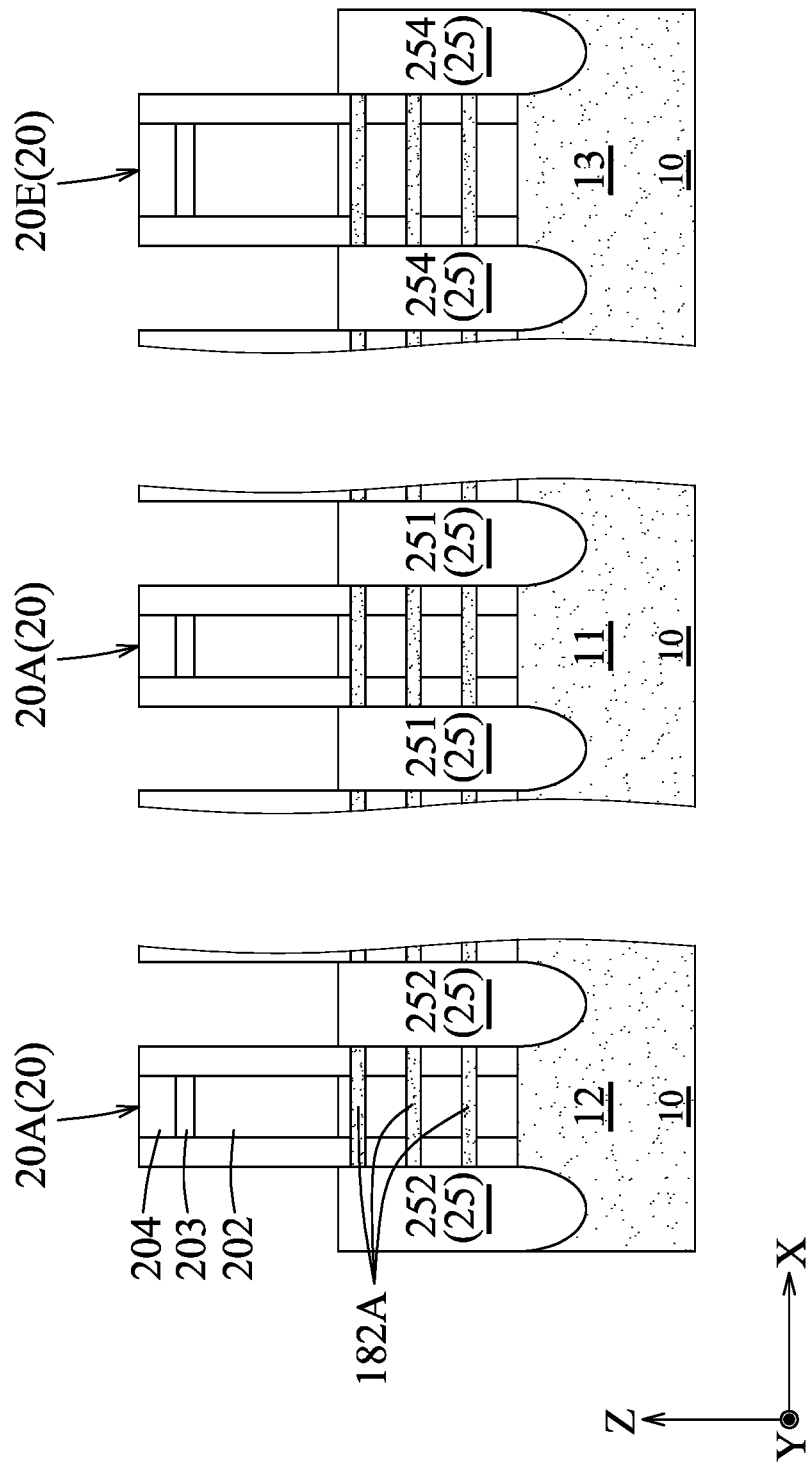

Referring to FIG. 1 and the examples illustrated in FIGS. 13, 14, 17 and 18, the method 100 proceeds to step 105, where a plurality of source/drain features 25 are respectively formed in the source/drain recesses 23 shown in FIG. 16 by an epitaxial growth process including CVD, molecular-beam epitaxy (MBE), an epitaxial deposition/partial etch process, such as a cyclic deposition-etch (CDE) process and/or a selective epitaxial growth (SEG) process, but is not limited thereto. Each pair of source/drain features 25 are formed at two opposite sides of the channel features 182A in the X direction, such that each of the channel features 182A interconnects a corresponding pair of the source/drain features 25. It is noted that each of the source/drain features 25 may refer to a source or a drain, individually or collectively dependent upon the context. FIG. 17 is a schematic view similar to FIG. 15 but further illustrating the source/drain features 25, and the gate spacers 21 and the fin sidewalls 22 shown in FIG. 15 are omitted for the sake of simplicity and clarity. FIGS. 17 and 18 are views similar to those of FIGS. 15 and 16, but illustrating the structure after step 105. The structures shown in FIGS. 13 and 14 are substantially not changed after step 105.

Each pair of the source/drain features 25 may be independently doped with an n-type impurity or a p-type impurity, and may be formed as a single layer structure or a multi-layered structure having several sub-layers with different doping concentration.

In some embodiments, as shown in FIG. 17, first source/drain features 251 and second source/drain features 252 are respectively formed on the first fin 11 and the second fin 12 of each pair 1A, 1B. Third source/drain features 253, fourth source/drain features 254 and fifth source/drain features 255 are respectively formed on the main fin 130, the first auxiliary fin 131 and the second auxiliary fin 132.

The source/drain features 25 formed on different fins 11, 12, 13 may have different conductivity types. For example, the first source/drain features 251 which are disposed on the first fin 11 of the first pair 1A, the second source/drain features 252 which are disposed on the second fin 12 of the second pair 1B, the fourth source/drain features 254, and the fifth source/drain features 255 may each have an n-type conductivity so as to function as a source/drain of an n-FET, and may include single crystalline silicon, polycrystalline silicon or other suitable materials doped with an n-type impurity. The n-type impurity may be, for example, but not limited to, nitrogen (N), phosphorous (P), arsenic (As), antimony (Sb), other suitable materials, or combinations thereof. In addition, the second source/drain features 252 which are disposed on the second fin 12 of the first pair 1A, the first source/drain features 251 which are disposed on the second fin 12 of the second pair 1B, and the third source/drain features 253 may each have a p-type conductivity so as to function as a source/drain of a p-FET, and may include single crystalline or polycrystalline silicon, single crystalline or polycrystalline silicon germanium, or other suitable materials doped with a p-type impurity. The p-type impurity may be, for example, but not limited to, boron (B), aluminum (Al), gallium (Ga), indium (In), other suitable materials, or combinations thereof.

Figure 19:
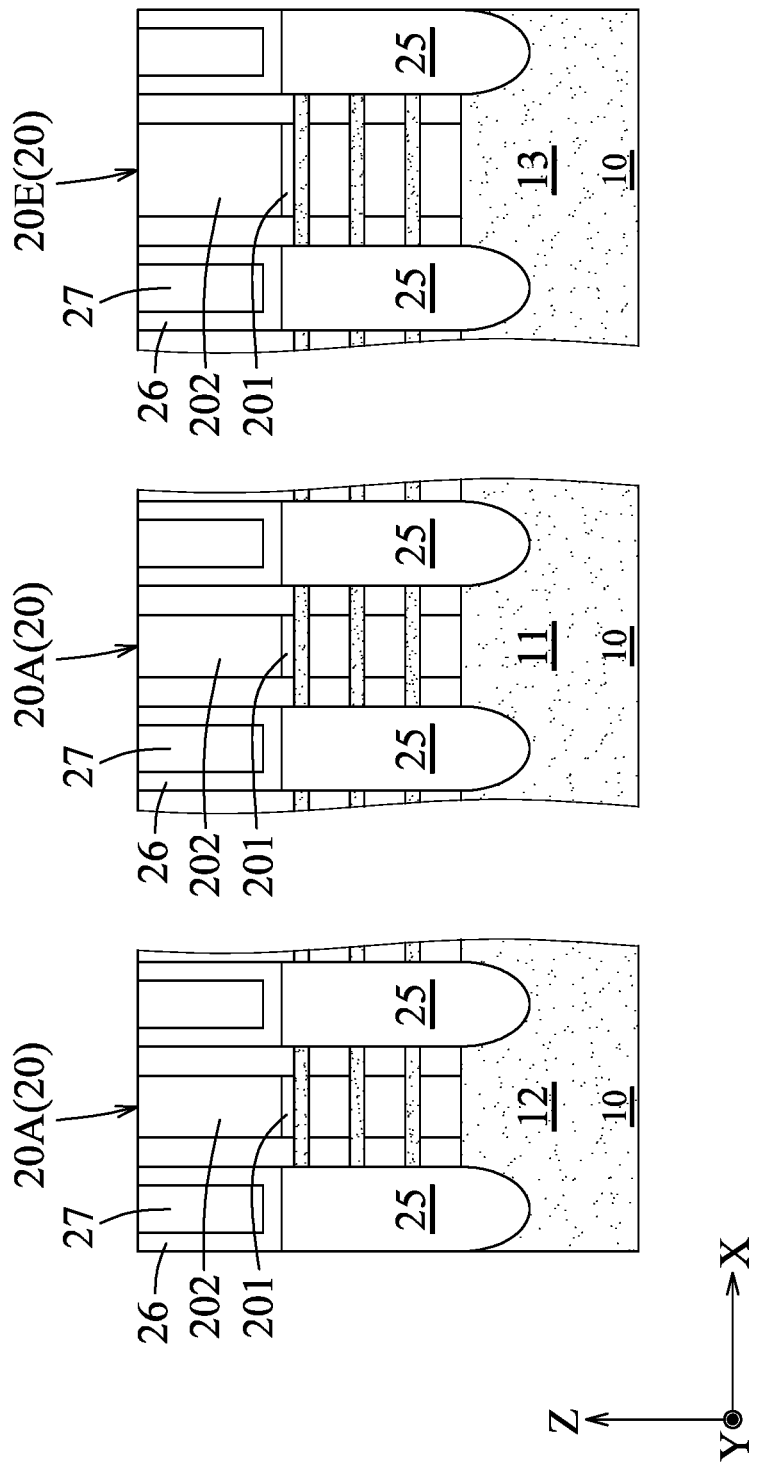

Referring to FIG. 1 and the examples illustrated in FIGS. 13, 14 and 19, the method 100 proceeds to step 106, where a plurality of contact etching stop features 26 and a plurality of inter-layer dielectric (ILD) features 27 are sequentially and respectively formed on the source/drain features 25. FIG. 19 is a view similar to that of FIG. 18, but illustrating the structure after step 106. The structures shown in FIGS. 13 and 14 are substantially not changed after step 106.

In some embodiments, step 106 is performed by sequentially depositing a contact etching stop layer (not shown) and an ILD layer (not shown) sequentially over the structure shown in FIG. 18 using a blanket deposition process, such as, but not limited to, CVD or molecular layer deposition (MLD), followed by a planarization process, for example, but not limited to, CMP, thereby removing the hard mask 204 and the polish stop layer 203 (see FIG. 18) of each of the dummy gate portions 20 and exposing the dummy gate electrode 202 of each of the dummy gate portions 20. Thereafter, the contact etching stop layer is formed into the contact etching stop features 26 and the ILD layer is formed into the ILD features 27. In some embodiments, the contact etching stop layer for forming the contact etching stop features 26 may include, for example, but not limited to, silicon nitride, carbon-doped silicon nitride, other suitable materials, or combinations thereof. In some embodiments, the ILD layer for forming the ILD features 27 may include a dielectric material such as, but not limited to, silicon oxide, silicon nitride, silicon oxynitride, other suitable materials, or combinations thereof. Other suitable materials for the contact etching stop features 26 and the ILD features 27 are within the contemplated scope of the present disclosure.

Figure 20:
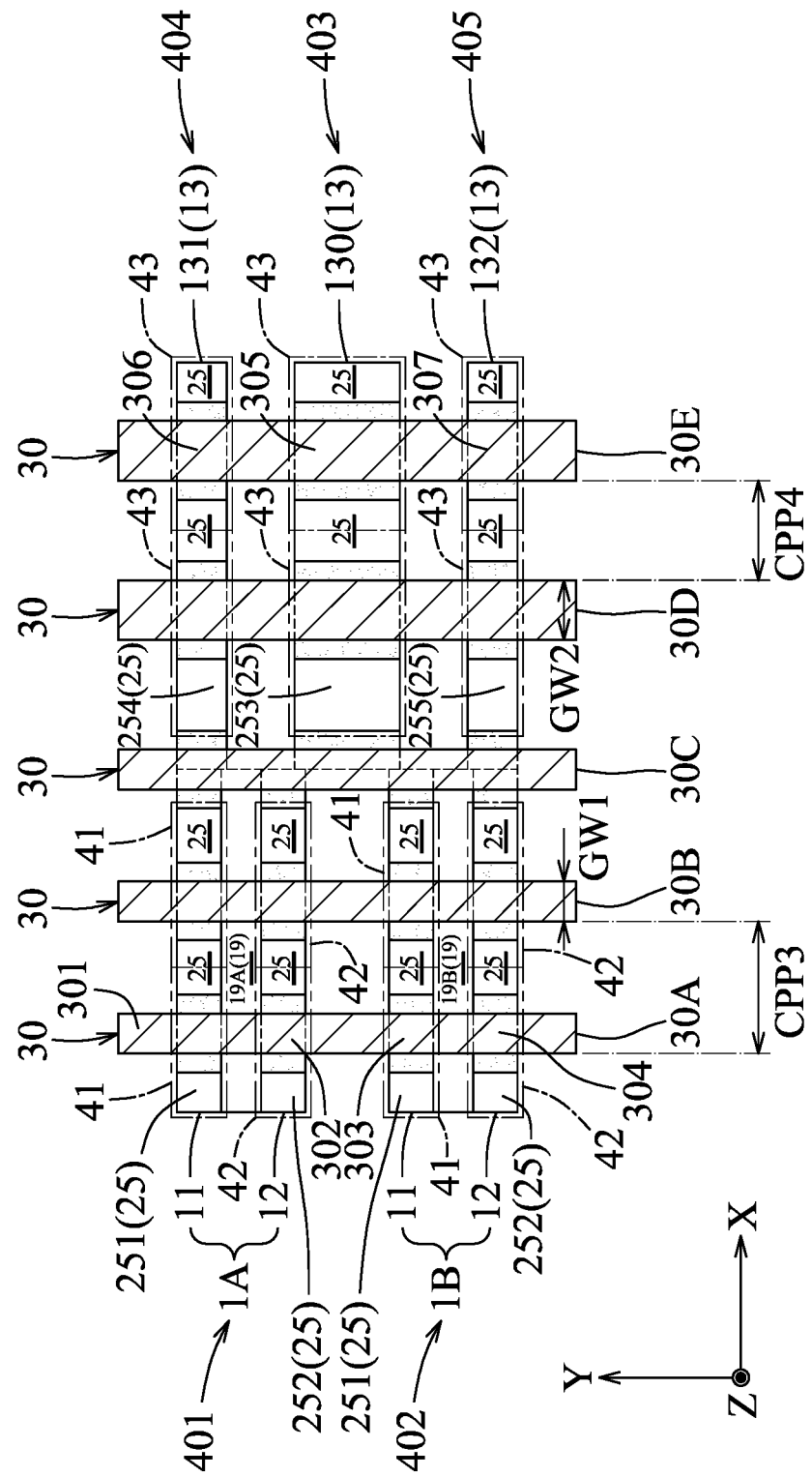
Figure 21:
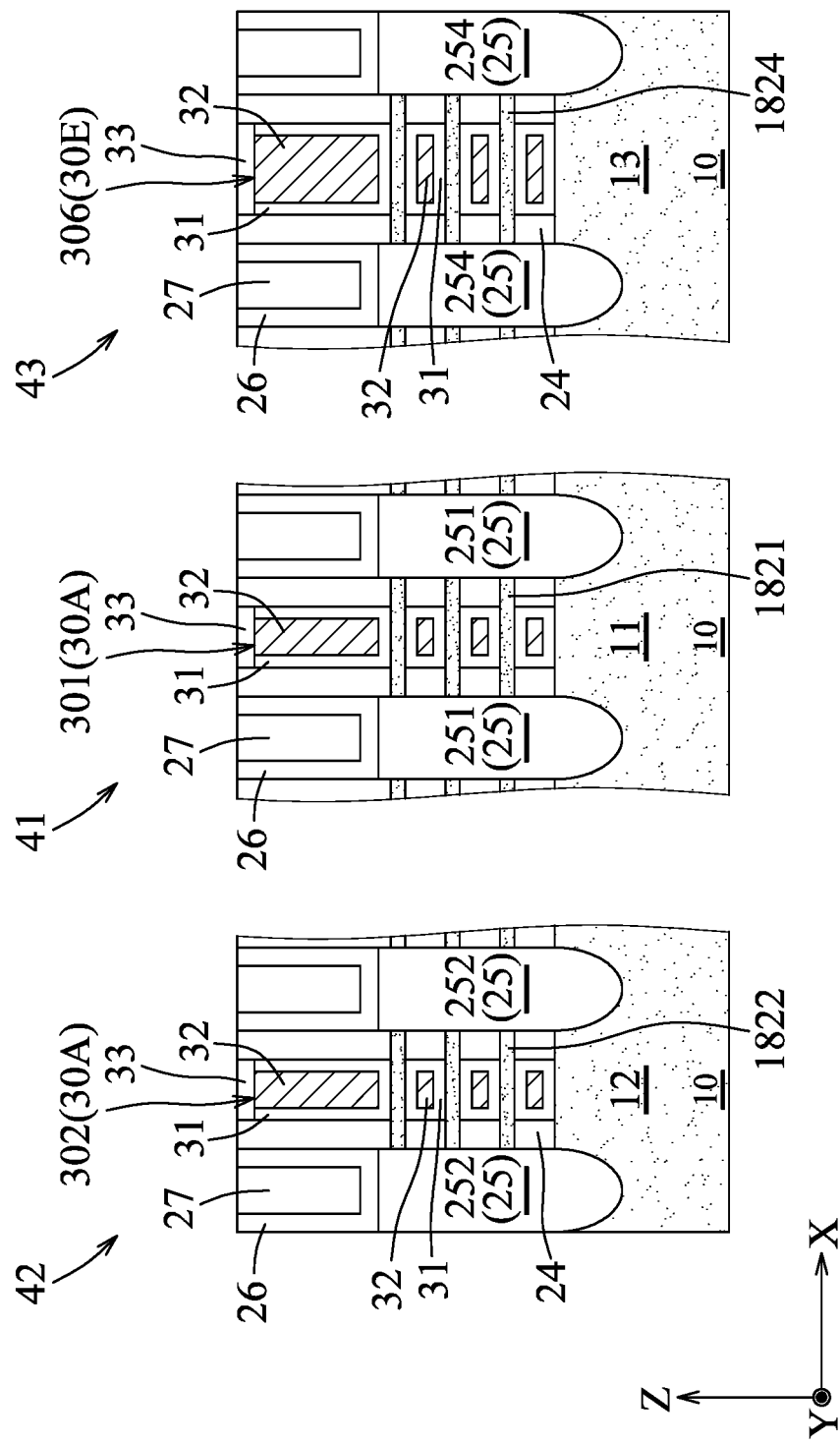

Referring to FIG. 1 and the examples illustrated in FIGS. 20 to 23, the method 100 proceeds to step 107, where a replacement gate process is performed such that the remaining dummy gate portions 20 (see FIG. 19) are respectively replaced with a plurality of gate structures 30 each including a gate dielectric layer 31 and a gate feature 32 disposed on the gate dielectric layer 31. FIG. 20 is a schematic view similar to FIG. 17 but the remaining dummy gate portions 20 are replaced with the gate structures 30, respectively. FIGS. 20 to 23 are views similar to those of FIGS. 17, 19, 13 and 14, but illustrating the structure after step 107.

In some embodiments, step 107 includes (i) removing the dummy gate electrode 202 and the dummy gate dielectric 201 of each of the remaining dummy gate portions 20 to form a plurality of cavities (not shown) using dry etching, wet etching, other suitable processes, or combinations thereof, (ii) sequentially depositing materials for forming the gate dielectric layer 31 and the gate feature 32 to fill the cavities by a blanket deposition process, such as ALD, CVD or MLD, and (iii) performing a planarization process, for example, but not limited to, CMP, to remove excesses of the materials for forming the gate feature 32 and the gate dielectric layer 31 and to expose the ILD features 27, and (iv) etching back the materials for forming the gate dielectric layer 31 and the gate feature 32 using for example, but not limited to, dry etching, wet etching, other suitable processes, or combinations thereof, thereby obtaining the gate structures 30 respectively in the cavities.

In some embodiments, the gate dielectric layer 31 of each of the gate structures 30 includes silicon oxide, silicon nitride, silicon oxynitride, a suitable high-k material (such as the examples described in the preceding paragraph), other suitable materials, or combinations thereof. Other suitable materials for the gate dielectric layer 31 are within the contemplated scope of the present disclosure. In some embodiments, the gate feature 32 of each of the gate structures 30 may be configured as a multi-layered structure including at least one work function metal which is provided for adjusting threshold voltage of an n-FET or an p-FET, an electrically conductive material having a low resistance which is provided for reducing electrical conductivity of the gate feature 32, other suitable materials, or combinations thereof. In some embodiments, the work function metal of the gate feature 32 of each of the gate structures 30 for forming an n-FET may be different from that for forming a p-FET so as to permit the n-FET and the p-FET to have different threshold voltages. Other suitable methods for adjusting the threshold voltages are within the contemplated scope of the present disclosure. In some embodiments, the gate feature 32 includes a metal material (e.g., tungsten (W), titanium (Ti), tantalum (Ta), aluminum (Al), or ruthenium (Ru)), metal-containing nitrides (e.g., titanium nitride (TiN), or tantalum nitride (TaN)), metal-containing silicides (e.g., nickel silicide (NiSi)), metal-containing carbides (e.g., tantalum carbide (TaC)), or combinations thereof. Other suitable materials for the gate feature 32 are within the contemplated scope of the present disclosure.

In some embodiments, step 107 further includes depositing a dielectric material for forming a plurality of self-aligned dielectric features 33 on the structure obtained after formation of the gate structures 30 using a blanket deposition process, such as, but not limited to, CVD, ALD, or other suitable deposition techniques, followed by a planarization process, for example, but not limited to, CMP, or other suitable processes, to expose the ILD features 27, thereby obtaining the self-aligned dielectric features 33 respectively disposed on the gate structures 30. In some embodiments, the dielectric material for forming the self-aligned dielectric features 33 include silicon oxide, silicon nitride, silicon oxynitride, but is not limited thereto.

After step 107, as shown in FIG. 20, the remaining dummy gate portions 20A to 20E (see FIG. 17) are replaced with the gate structures 30A to 30E, respectively. Each of the gate structures 30A to 30E has a gate width in the X direction. In some embodiments, each of the gate structures 30D, 30E may have a second gate width (GW2) that is greater than a first gate width (GW1) of each of the gate structures 30A, 30B, 30C. In some embodiments, a ratio of the second gate width (GW2) to the first gate width (GW1) may range from about 1.1 to about 1.5.

Each of the gate structures 30A, 30B has a side surface which is distal from the gate structure 30C, and the side surfaces of two adjacent ones of the gate structures 30A, 30B are spaced apart by a third pitch (CPP3). Each of the gate structures 30D, 30E has a side surface which is distal from the gate structure 30C, and the side surfaces of two adjacent ones of the gate structure 30D, 30E are spaced apart by a fourth pitch (CPP4). The third and fourth pitches (CPP3, CPP4) are substantially the same as the first and second pitches (CPP1, CPP2), respectively, as described above with reference to FIG. 12. In some embodiments, the third pitch (CPP3) may be the same as the fourth pitch (CPP4). In some other embodiments, as shown in FIG. 20, the fourth pitch (CPP4) is greater than the third pitch (CPP3). In some embodiments, the fourth pitch (CPP4) may be greater than the third pitch (CPP3) by about 5% to about 20%. That is, a ratio of the fourth pitch (CPP4) to the third pitch (CPP3) may range from about 1.05 to about 1.2.

Figure 22:
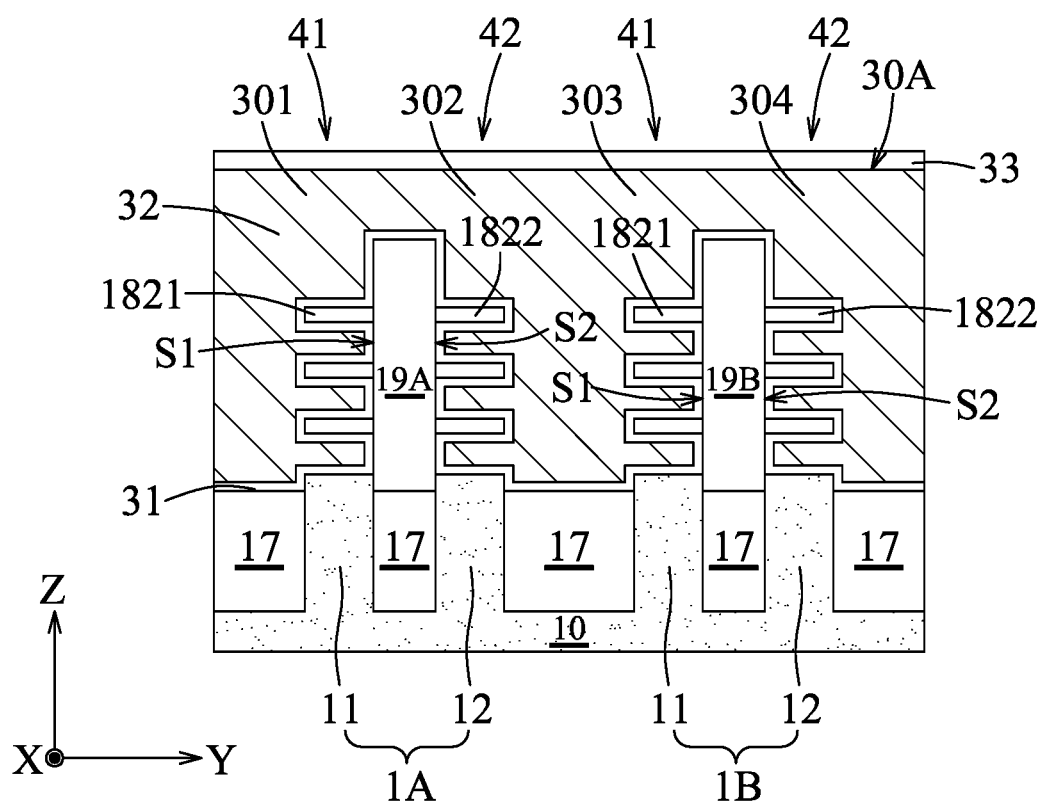

For each of the gate structures 30A, 30B which is disposed over the first and second fins 11, 12 (the gate structure 30A is shown in FIG. 22), the gate dielectric layer 31 is disposed to separate the gate feature 32 from the first and second channel features 1821, 1822, corresponding ones of the inner spacers 24 (see FIG. 21) and the dielectric walls 19. Each of the gate structures 30A, 30B includes a first real gate portion 301, a second real gate portion 302, a third real gate portion 303 and a fourth real gate portion 304 displaced from one another in the Y direction. The first real gate portion 301 is disposed around the first channel features 1821 which are disposed over the first fin 11 of the first pair 1A. The second real gate portion 302 is disposed around the second channel features 1822 which are disposed over the second fin 12 of the first pair 1A. The third real gate portion 303 is disposed around the first channel features 1821 which are disposed over the first fin 11 of the second pair 1B. The fourth real gate portion 304 is disposed around the second channel features 1822 which are disposed over the second fin 12 of the second pair 1B.

Figure 23:
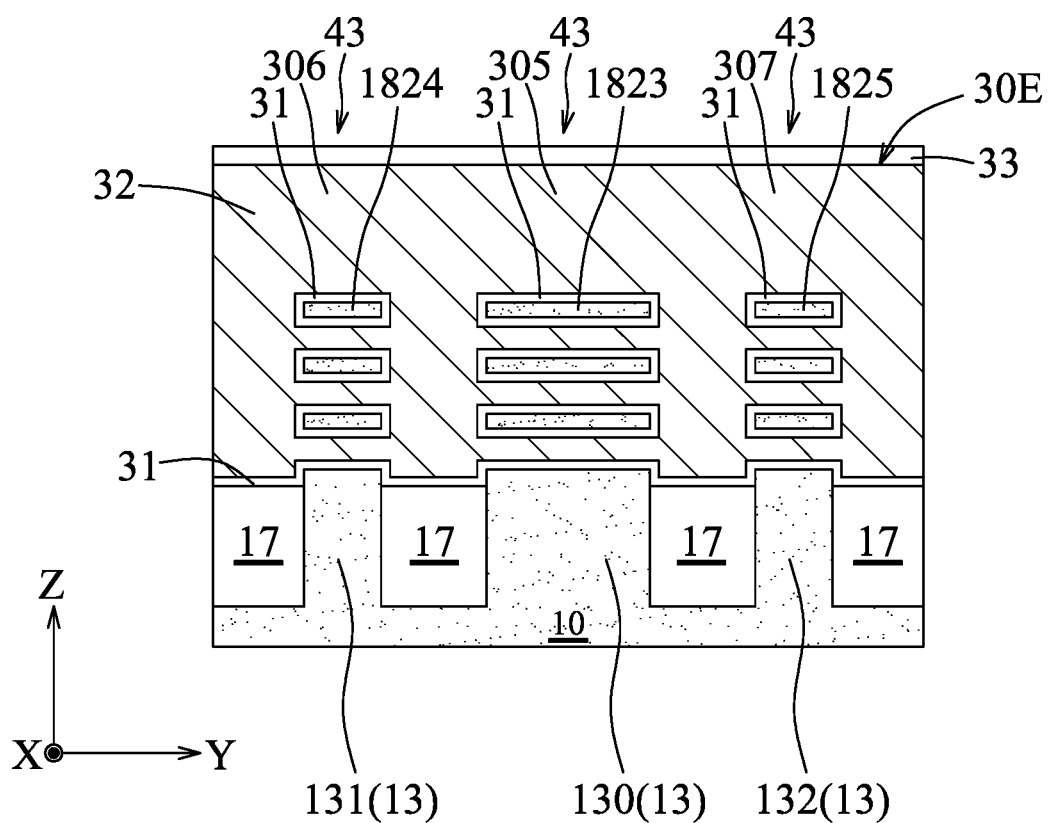

For each of the gate structures 30D, 30E which is disposed over the third fins 13 (the gate structure 30E is shown in FIG. 23), the gate dielectric layer 31 is disposed to separate the gate feature 32 from the channel features 1823, 1824, 1825 and corresponding ones of the inner spacers 24. Each of the gate structures 30D, 30E includes a fifth real gate portion 305, a six real gate portion 306 and a seventh real gate portion 307 displaced from one another in the Y direction. The fifth real gate portion 305 is disposed to surround the third channel features 1823. The sixth real gate portion 306 is disposed to surround the fourth channel features 1824. The seventh real gate portion 306 is disposed to surround the fifth channel features 1825.

As shown in FIG. 20, the gate structure 30C includes a first portion and a second portion displaced from the first portion in the X direction. The first portion is located in position above the first and second fins 11, 12, and the second portion is located in position above the third fins 13. Hence, the first portion of the gate structure 30C is disposed around corresponding ones of the channel features 182A which are disposed over the first and second fins 11, 12, and the second portion of the gate structure 30C is disposed to surround corresponding ones of the channel features 182A which are disposed over the third fins 13.

In some embodiments, at least one device unit and at least one device assembly is thus formed on the substrate 10 after step 107. The at least one device unit includes (i) a single first fin 11 and a single second fin 12 spaced apart from each other in the Y direction, (ii) at least one first device 41 and at least one second device 42 respectively formed the first and second fins 11, 12, and (iii) a single dielectric wall 19 disposed between the first and second devices 41, 42. The at least one device assembly includes (i) a single third fin 13 which is in direct contact with at least one of the first and second fins 11, 12, and (ii) at least one third device 43 formed on the third fin 13.

The number of the device unit and the number of the device assembly may vary according to practical requirements. For example, as shown in FIG. 20, two devices units 401, 402, and three device assemblies 403, 404, 405 are formed on the substrate 10.

As shown in FIGS. 20 and 22, the device unit 401 includes (i) the first and second fins 11, 12 of the first pair 1A which are spaced apart from each other in the Y direction, (ii) the first dielectric wall 19A which has a first wall surface (51) and a second wall surface (S2), and (iii) at least one first device 41 and at least one second device 42 which are respectively formed on the first and second fins 11, 12 of the first pair 1A. In some embodiments, the first wall surface (51) and the second wall surface (S2) are opposite to each other.

The at least one first device 41 in the device unit 401 includes (i) the first channel features 1821 extending away from the first wall surface (51) of the first dielectric wall 19A to be disposed over the first fin 11 of the first pair 1A so as to permit the first channel features 1821 to be spaced apart from each other in the Z direction (see FIG. 22), (ii) a pair of the first source/drain features 251 which are disposed on the first fin 11 of the first pair 1A, and which are spaced apart from each other in the X direction such that each of the first channel features 1821 interconnects the pair of the first source/drain features 251 (see FIG. 21), and (iii) the first real gate portion 301 of a corresponding one of the gate structures 30A, 30B such that the pair of the first source/drain features 251 are respectively located at two opposite sides of the first real gate portion 301 of the corresponding gate structure 30A, 30B in the X direction.

The at least one second device 42 in the device unit 401 includes (i) the second channel features 1822 extending away from the second wall surface S2 of the first dielectric wall 19A to be disposed over the second fin 12 of the first pair 1A so as to permit the second channel features 1822 to be spaced apart from each other in the Z direction (see FIG. 22), (ii) a pair of the second source/drain features 252 which are disposed on the second fin 12 of the first pair 1A, and which are spaced apart from each other in the X direction such that each of the second channel features 1822 interconnects the pair of the second source/drain features 252 (see FIG. 21), and (iii) the second real gate portion 302 of a corresponding one of the gate structures 30A, 30B such that the pair of the second source/drain features 252 are respectively located at two opposite sides of the second real gate portion 302 of the corresponding gate structure 30A, 30B in the X direction. In some embodiments, in the device unit 401, the second real gate portion 302 of the at least one second device 42 and the first real gate portion 301 of the at least one first device 41 may extend toward each other in the Y direction to merge on the first dielectric wall 19A (see FIGS. 20 and 22).

As shown in FIGS. 20 and 22, the device unit 402 includes (i) the first and second fins 11, 12 of the second pair 1B which are spaced apart from each other in the Y direction, (ii) the second dielectric wall 19B which has a first wall surface (51) and a second wall surface (S2), and (iii) at least one first device 41 and at least one second device 42 which are respectively formed on the first and second fins 11, 12 of the second pair 1B.

The at least one first device 41 in the device unit 402 includes (i) the first channel features 1821 extending away from the first wall surface (51) of the second dielectric wall 19B to be disposed over the first fin 11 of the second pair 1B so as to permit the first channel features 1821 to be spaced apart from each other in the Z direction, (ii) a pair of the first source/drain features 251 which are disposed on the first fin 11 of the second pair 1B, and which are spaced apart from each other in the X direction such that each of the first channel features 1821 interconnects the pair of the first source/drain features 251, and (iii) the third real gate portion 303 of a corresponding one of the gate structures 30A, 30B such that the pair of the first source/drain features 251 are respectively located at two opposite sides of the third real gate portion 303 of the corresponding gate structure 30A, 30B in the X direction.

The at least one second device 42 in the device unit 402 includes the second channel features 1822 extending away from the second wall surface (S2) of the second dielectric wall 19B to be disposed over the second fin 12 of the second pair 1B so as to permit the second channel features 1822 to be spaced apart from each other in the Z direction, (ii) a pair of the second source/drain features 252 which are disposed on the second fin 12 of the second pair 1B, and which are spaced apart from each other in the X direction such that each of the second channel features 1822 interconnects the pair of the second source/drain features 252, and (iii) the fourth real gate portion 304 of a corresponding one of the gate structures 30A, 30B such that the pair of the second source/drain features 252 are respectively located at two opposite sides of the fourth real gate portion 304 of the corresponding gate structure 30A, 30B in the X direction. In some embodiments, in the device unit 402, the fourth real gate portion 304 of the at least one second device 42 and the third real gate portion 303 of the at least one first device 41 may extend toward each other in the Y direction to merge on the second dielectric wall 19B. In some embodiments, the second real gate portion 302 of the at least one second device 42 in the device unit 401 and the third real gate portion 303 of the at least one first device 41 in the device unit 402 may extend toward each other in the Y direction to merge on one of the isolation regions 17 which is disposed between the second fin 12 of the first pair 1A of and the first fin 11 of the second pair 1B.

The device unit 403 includes the main fin 130 which is in direct contact with the second fin 12 of the first pair 1A and the first fin 11 of the second pair 1B, and at least one third device 43 which is formed on the main fin 130.

As shown in FIGS. 20 and 23, the at least one third device 43 in the device unit 403 includes the third channel features 1823 which are spaced apart from each other in the Z direction, a pair of the third source/drain features 253 which are spaced apart from each other in the X direction such that each of the third channel features 1823 interconnects the pair of the third source/drain features 253, and the fifth real gate portion 305 of a corresponding one of the gate structures 30D, 30E such that the pair of the third source/drain features 253 are respectively located at two opposite sides of the fifth real gate portion 305 of the corresponding gate structure 30D, 30E in the X direction.

The device unit 404 includes the first auxiliary fin 131 which is in direct contact with the first fin 11 of the first pair 1A, and at least one third device 43 which is formed on the first auxiliary fin 131.

As shown in FIGS. 20 and 23, the at least one third device 43 in the device unit 404 includes the fourth channel features 1824 which are spaced apart from each other in the Z direction, a pair of the fourth source/drain features 254 which are spaced apart from each other in the X direction such that each of the fourth channel features 1824 interconnects the pair of the fourth source/drain features 254, and the sixth real gate portion 306 of a corresponding one of the gate structures 30D, 30E such that the pair of the fourth source/drain features 254 are respectively located at two opposite sides of the sixth real gate portion 306 of the corresponding gate structure 30D, 30E in the X direction.

The device unit 405 includes the second auxiliary fin 132 which is in direct contact with the second fin 12 of the second pair 1B, and at least one third device 43 which is formed on the second auxiliary fin 132.

As shown in FIGS. 20 and 23, the at least one third device 43 in the device unit 405 includes the fifth channel features 1825 which are disposed over the second auxiliary fin 132, and which are spaced apart from each other in the Z direction, a pair of the fifth source/drain features 255 which are spaced apart from each other in the X direction such that each of the fifth channel features 1825 interconnects the pair of the fifth source/drain features 255, and the seventh real gate portion 307 of a corresponding one of the gate structures 30D, 30E such that the pair of the source/drain features 255 are respectively located at two opposite sides of the seventh real gate portion 307 of the corresponding gate structure 30D, 30E in the X direction.

In some embodiments, the fifth real gate portion 305 of the at least one third device 43 in the device unit 403 and the sixth real gate portion 306 of the at least one third device 43 in the device unit 404 extend toward each other in the Y direction to merge on one of the isolation regions 17 which is disposed between the main fin 130 and the first auxiliary fin 131. In some embodiments, the fifth real gate portion 305 of the at least one third device 43 in the device unit 403 and the seventh real gate portion 307 of the at least one third device 43 in the device unit 405 extend toward each other in the Y direction to merge on one of the isolation regions 17 which is disposed between the main fin 130 and the second auxiliary fin 132.

In some embodiments, the at least one first device 41 in the device unit 401, the at least one second device 42 in the device unit 402, and the third devices 43 in the device assemblies 404, 405 serve as n-FETs, while the at least one second device 42 in the device unit 401, the at least one first device 41 in the device unit 402, and the at least one third device 43 in the device assembly 403 serve as p-FETs.

Figure 24:
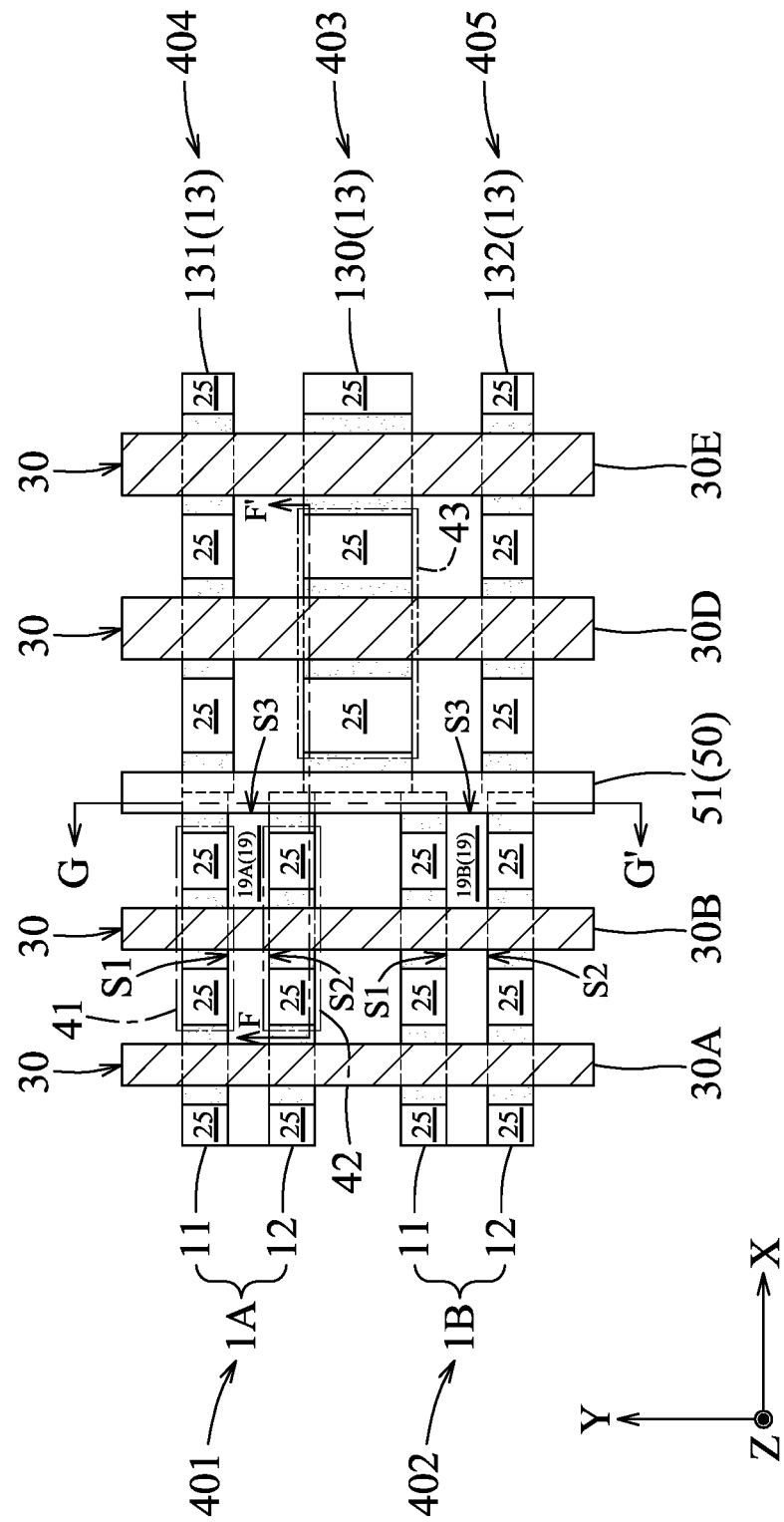
Figure 25:
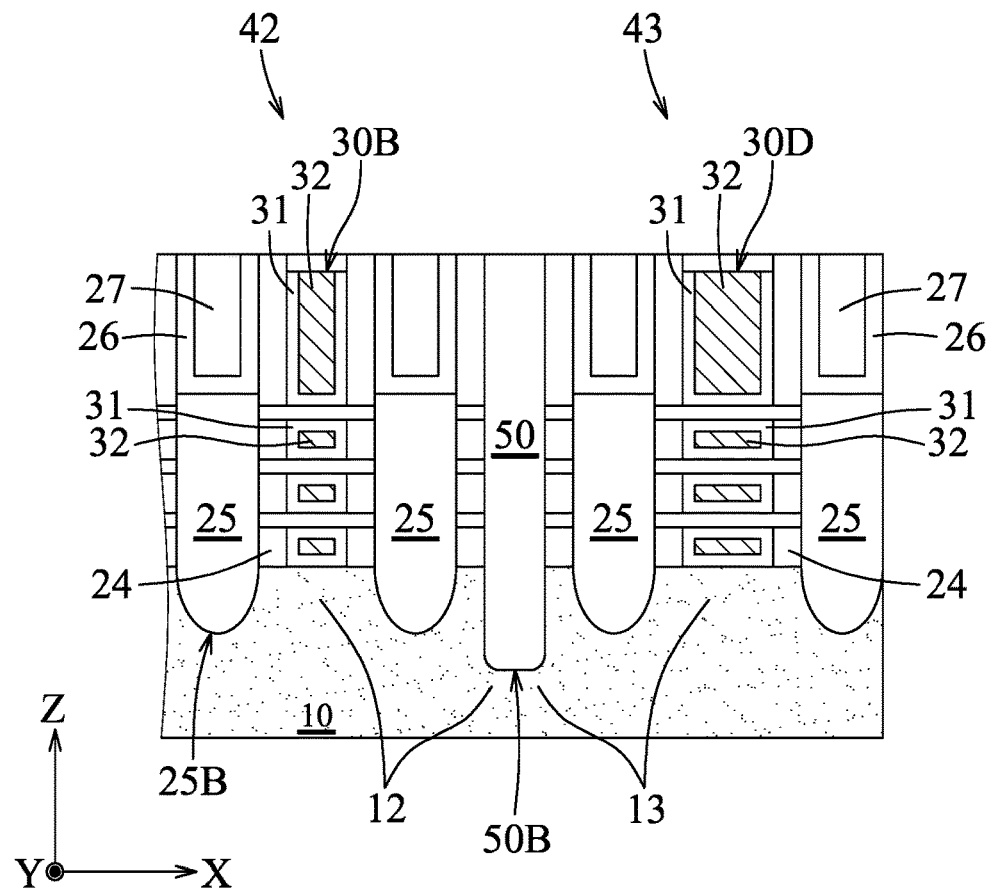
Figure 26:
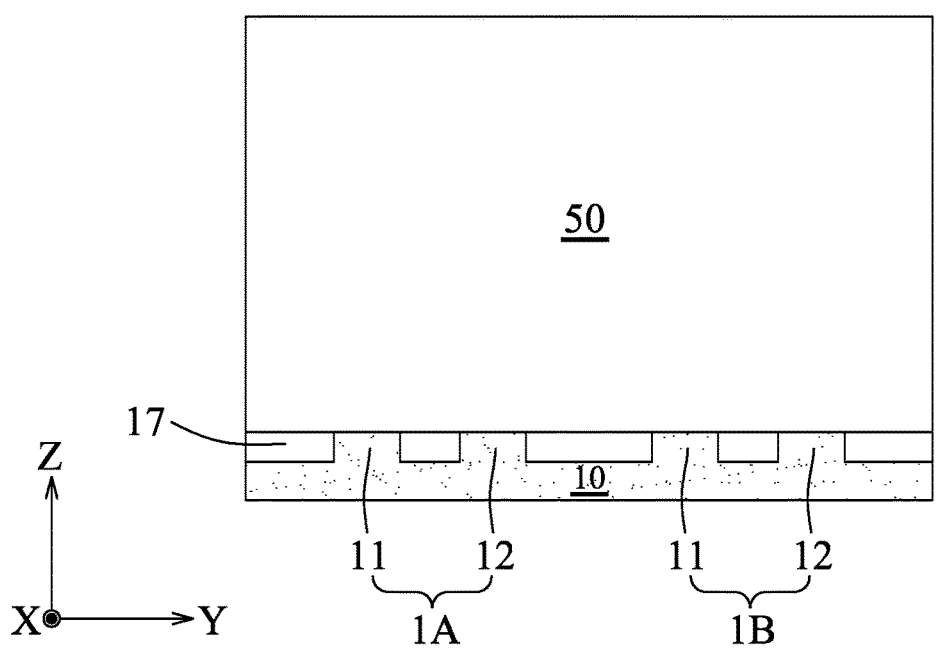

Referring to FIG. 1 and the examples illustrated in FIGS. 24 to 26, the method 100 proceeds to step 108, where an isolation feature 50 is formed over the substrate 10 to permit the third devices 43 to be electrically isolated from the first and second devices 41, 42. FIG. 24 is a schematic view similar to FIG. 20 but illustrating the structure after step 108. FIGS. 25 and 26 are a cross-sectional views respectively taken along lines F-F' and G-G' of FIG. 24 in accordance with some embodiments but further illustrating the other elements omitted in FIG. 24.

In some embodiments, as shown in FIG. 24, the isolation feature 50 includes a single gate isolation portion 51 which is made of a dielectric material, which is elongated in the Y direction through the first and second fins 11, 12 of the device units 401, 402 and through the third fins 13 of the device assembles 403, 404, 405, and which is spaced apart from each two adjacent ones of the gate structures 30B, 30D in the X direction.

After step 108, each of the dielectric walls 19 has an end surface (S3) interconnecting the first and second surfaces (S1, S2), and is spaced apart from the third devices 43. In some embodiments, as shown in FIG. 24, the isolation feature 50 is disposed to be in direct contact with the end surface S3 of each of the dielectric walls 19, such that in each of the device units 401, 402, one of the first devices 41 (which is most proximate to the isolation feature 50) can be ensured to be isolated and/or electrically isolated from one of the second devices 42 (which is most proximate to the isolation feature 50).

In some embodiments, as shown in FIG. 25, the isolation feature 50 has a bottom surface 50B at a level lower than a bottom surface 25B of each of the source/drain features 25 of the first, second and third devices 41, 42, 43, so as to electrically isolate the first, second, and third devices 41, 42, 43 which are the most proximate to the isolation feature 50 from one another.

In some embodiments, formation of the isolation feature 50 shown in FIG. 24 may include (i) forming a patterned photoresist layer on the structure obtained after step 107 to expose the gate structure 30C shown in FIG. 20 by spin-coating followed by a lithography process, (ii) performing an etching process (through the patterned photoresist by dry etching, wet etching, other suitable processes, or combinations thereof) to remove the gate structure 30C and the elements which are wrapped by the gate structure 30C (i.e., corresponding ones of the channel features 182A and portions of the dielectric walls 19) until portions of the first, second and third fins 11, 12, 13 beneath the gate structure 30C are partially removed so as to form a trench (not shown), and (ii) depositing the dielectric material for forming the gate isolation portion 51 to fill the trench, followed by a planarization process, for example, but not limited to, CMP, to remove an excess of the dielectric material for forming the gate isolation portion 51 until the ILD features 27 are exposed, thereby obtaining the isolation feature 50. In some embodiments, the dielectric material for forming the gate isolation portion 51 is similar to that for forming the dielectric walls 19, and thus details thereof are omitted for the sake of brevity. In some embodiments, the dielectric material of the gate isolation portion 51 may be the same as or different from that of the dielectric walls 19. It is worth mentioning that, as shown in FIGS. 25 and 26, portions of the first, second and third fins 11, 12, 13 still remain in position beneath the isolation feature 50 after step 108, so the direct contact between one of the third fins 13 and corresponding one(s) of the first and second fins 11, 12 can be observed after step 108.

Figure 27:
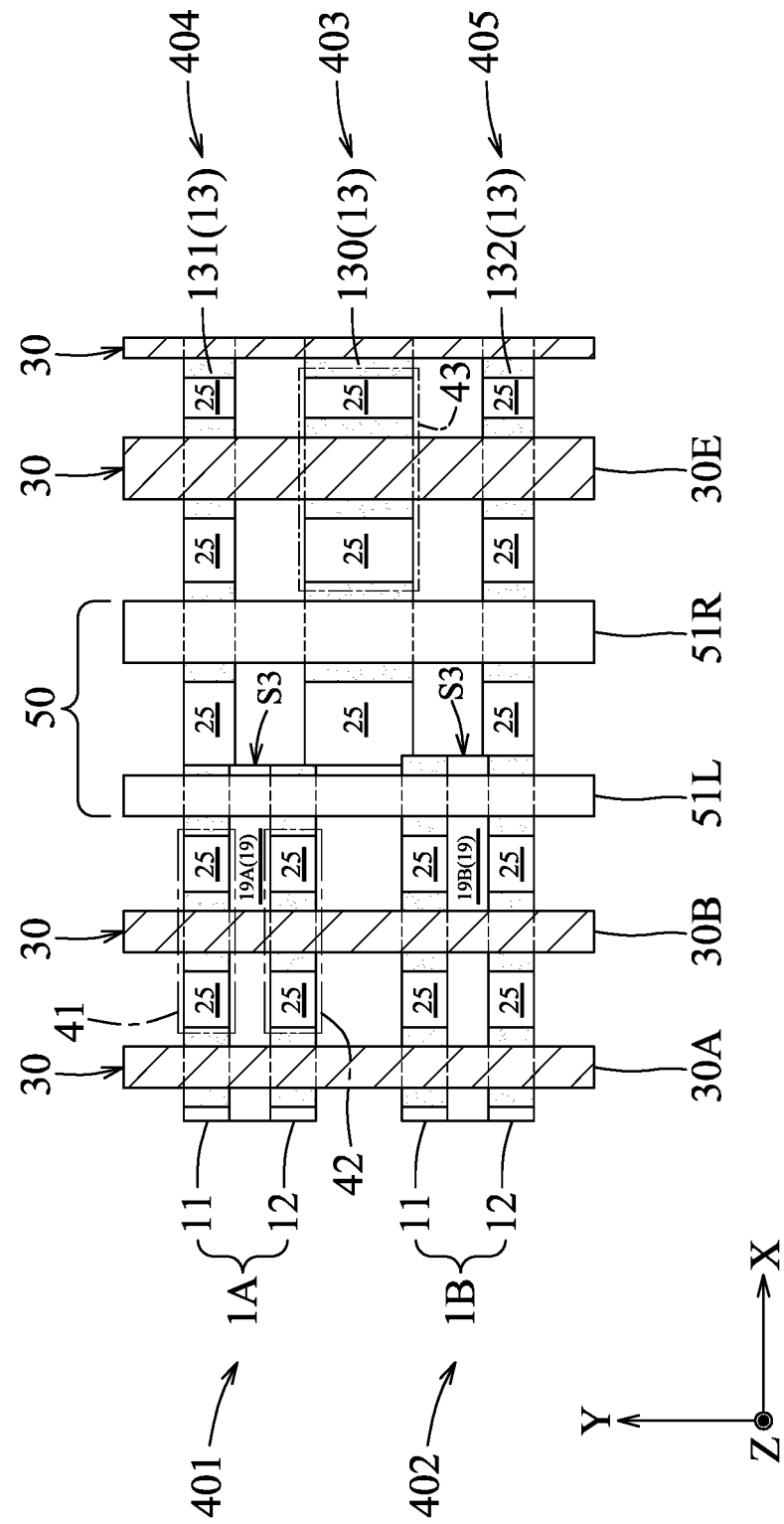
Figure 28:
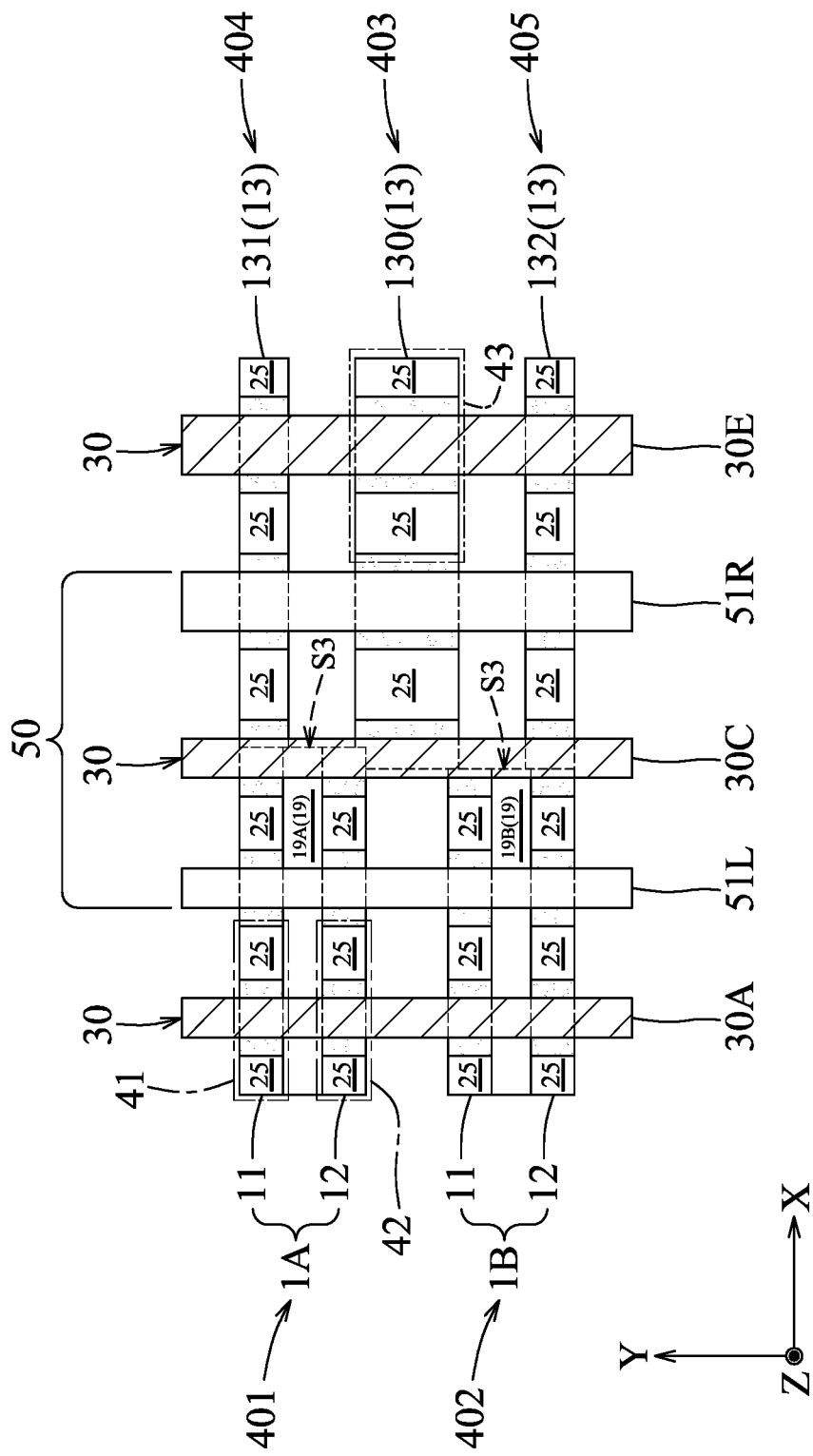

FIGS. 27 and 28 are views similar to that of FIG. 24, but illustrating first and second variants of the isolation feature 50 in accordance with some other embodiments.

Since process variation in steps 101 and 102 may cause each of the dielectric walls 19 to have different length in the X direction, at least two gate isolation portions 51L, 51R are included in the isolation feature 50 to compensate for such process variation. As shown in FIGS. 27 and 28, the isolation feature 50 includes at least two gate isolation portions 51L, 51R which are elongated in the Y direction and spaced apart from each other in the X direction, and which are located at two opposite sides of the end surface (S3) of each of the dielectric walls 19. A proximate one of the gate isolation portions 51L is formed to penetrate each of the dielectric walls 19, and a distal one of the gate isolation portions 51R is formed to be spaced apart from the end surface (S3) of each of the dielectric walls 19. In some embodiments, the elements disposed between the two gate isolation portions 51L, 51R are dummy elements, and may be referred to as fillers.

Furthermore, each of the device units 401, 402 is spaced apart from each of the device assemblies 403, 404, 405 by a distance in the X direction. The distance may be adjusted by the number and/or distribution of the gate isolation portions 51 in the isolation feature 50, and may be less than ten times the first pitch (CPP1) or greater than 0.1 time the first pitch (CPP1). For example, the isolation features 50 shown in FIGS. 27 and 28 both include two gate isolation portions 51L, 51R which are made by replacement of different gate structures. In details, the isolation feature 50 of the first variant shown in FIG. 27 is formed by (i) performing an etching process to remove the gate structures 30C, 30D and portions of elements beneath the gate structures 30C, 30D until portions of the first and second fins 11, 12 beneath the gate structure 30C are partially removed, and portions of the third fins 13 beneath the gate structure 30D are partially removed so as to form the trenches, and (ii) filling the trenches using the dielectric material for forming the gate isolation portions 51. The isolation feature 50 shown in FIG. 28 is formed by a manner similar to that of the first variant, except that in the etching process of the second variant, the gate structures 30B, 30D (rather than the gate structures 30C, 30D) and portions of elements beneath the gate structures 30B, 30D are removed. Therefore, the isolation feature 50 shown in FIG. 28 has a dimension in the X direction that is greater than a dimension of the isolation feature 50 shown in FIG. 27 in the X direction. That is, in FIG. 28, the device assemblies 403, 404, 405 are spaced apart from the device units 401, 402 by a greater distance in the X direction. Accordingly, the third devices 43 in the device assemblies 403, 404, 405 shown in FIG. 28 may be less affected (or disturbed) by the first and second devices 41, 42 in the device units 401, 402 during operation.

Figure 29:
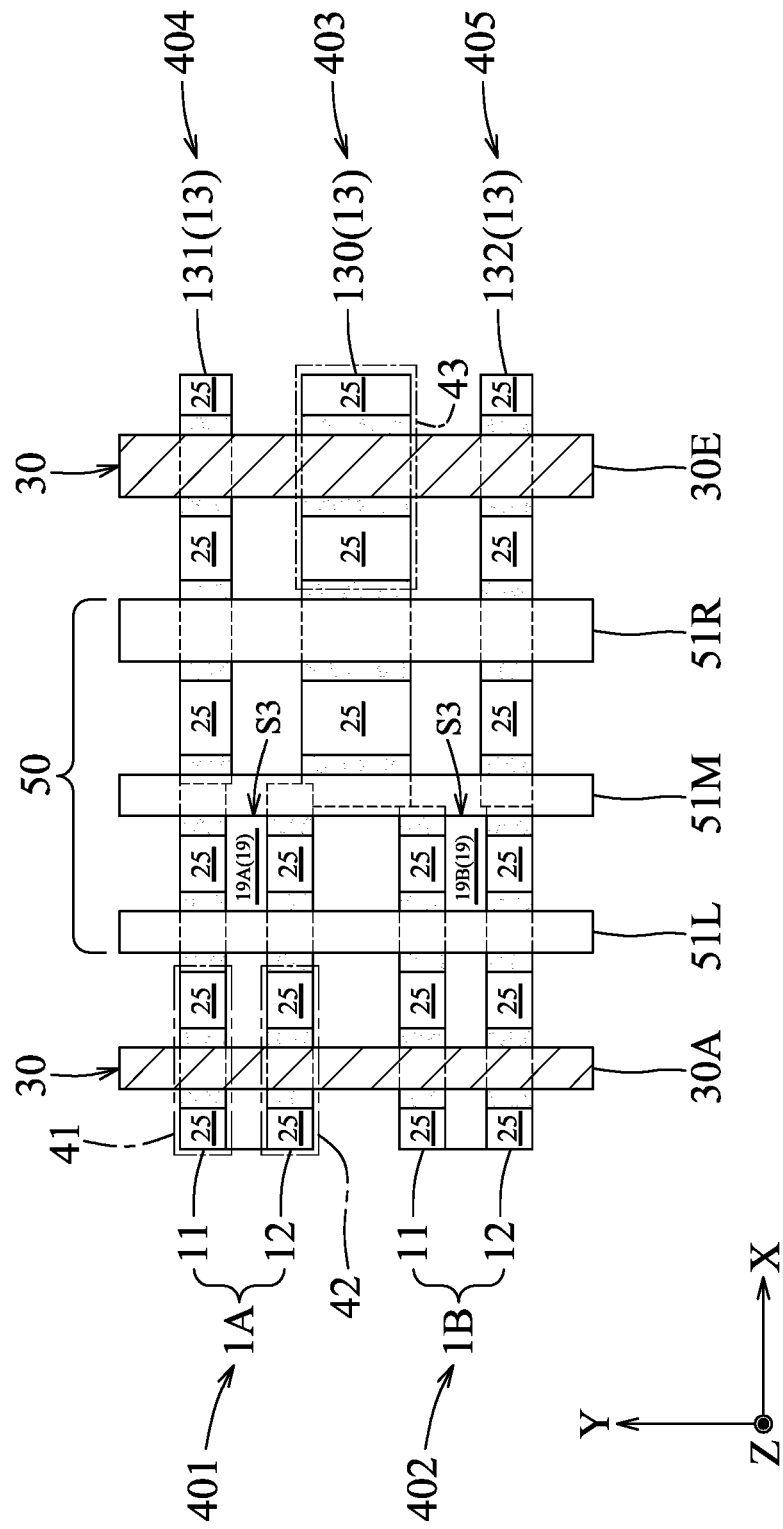

FIG. 29 is a view similar to that of FIG. 28, but illustrating a third variant of the isolation feature 50 in accordance with some other embodiments. The isolation feature 50 shown in FIG. 29 may be formed by a manner similar to that for forming the isolation feature 50 shown in FIG. 28 except that in the etching process of the third variant, the gate structure 30C shown in FIG. 28 and portions of elements therebeneath are removed together with removal of the gate structures 30B, 30D to expose the etched portions of first, second and third fins 11, 12, 13. Therefore, in the third variant, the isolation feature 50 further includes a gate isolation portion 51M between the gate isolation portions 51L, 51R.

Figure 30:
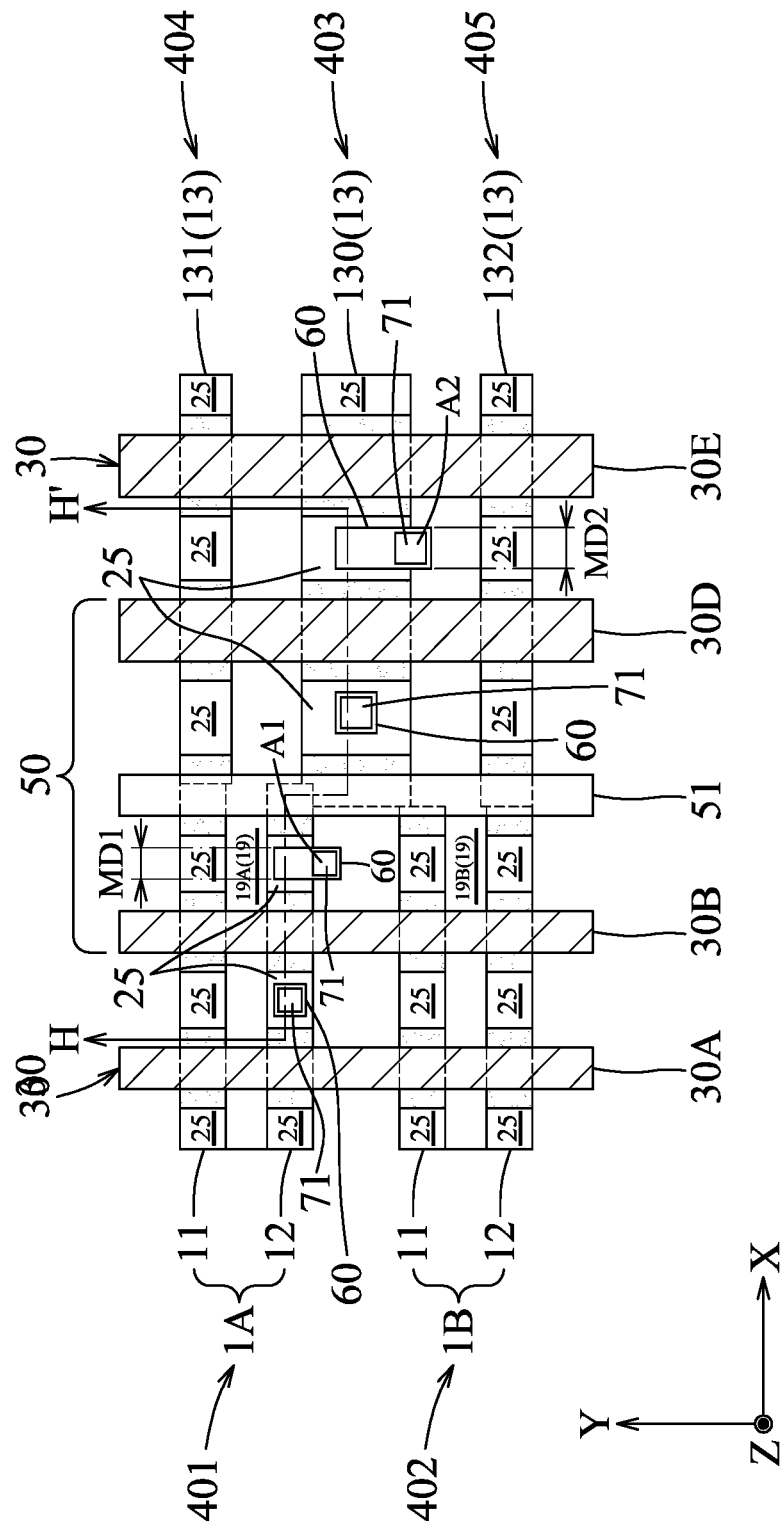
Figure 31:
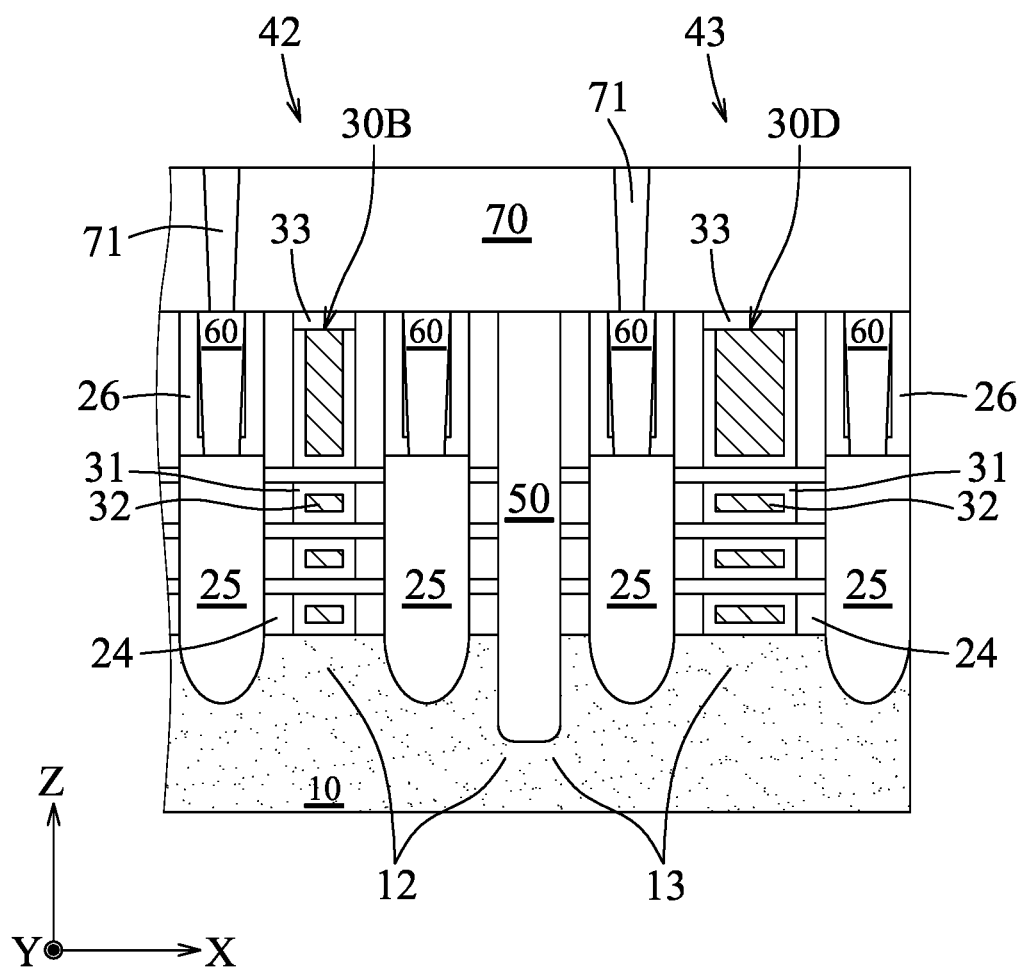

Referring to FIG. 1 and the examples illustrated in FIGS. 30 and 31, the method 100 proceeds to step 109, where a plurality of contact features 60 and contact vias 71 are respectively formed on the source/drain features 25, and the semiconductor structure 90 is thus formed. FIG. 30 is a view similar to that of FIG. 24, but further illustrating the contact features 60 (two pairs of the contact features 60 and two pairs of the contact via 71 are shown). FIG. 31 is a cross-sectional view taken along lines H-H' of FIG. 30 in accordance with some embodiments but further illustrating the other elements omitted in FIG. 30.

In some embodiments, when the fourth pitch (CPP4) is greater than the third pitch (CPP3), as shown in FIG. 20, each of the contact features 60 formed on a corresponding one of the source/drain features 25 in the device assemblies 403, 404, 405 may have a width (MD2) in the X direction that is greater than a width (MD1) of each of the contact features 60 formed on a corresponding one of the source/drain features 25 in the device units 401, 402. In some embodiments, a ratio of the width (MD2) to the width (MD1) may range from about 1.2 to about 3. Furthermore, in some embodiments, each of the contact vias 71 disposed on a corresponding one of the contact features 60 on the source/drain features 25 in the device assemblies 403, 404, 405 may have an area (A2) that is greater than an area (A1) of each of the contact vias 71 disposed on a corresponding one of the contact features 60 on the source/drain features 25 in the device unit 401, 402. In some embodiments, a ratio of the area (A2) to the area (A1) may range from about 1.1 to about 5. Accordingly, a relatively large current is allowed to pass through the contact features 60 and the contact vias 71 which are sequentially and respectively disposed on the source/drain features 25 in the device assemblies 403, 404, 405.

In some embodiments, step 109 includes sub-steps of: (i) forming a patterned mask (not shown) on the structure obtained after step 108; (ii) performing an etching process (for example, but not limited to, dry etching, wet etching, or a combination thereof) through the patterned mask layer to form openings (not shown), each extending through a corresponding one of the ILD features 27 and a corresponding one of the contact etching stop features 26 shown in FIG. 25 to expose a corresponding one of the source/drain features 25; (iii) filling a conductive material for forming the contact features 60 in the openings using for example, but not limited to, ALD, CVD, plating, or other suitable techniques; (iv) removing an excess of the conductive material for forming the contact features 60 to expose the self-aligned dielectric features 33 and the isolation feature 50 using CMP or other suitable techniques to form the contact features 60; (v) forming an inter-metal dielectric (IMD) layer 70 on the structure after formation of the contact features 60; and (vi) forming the contact vias 71 in the IMD layer 70 in a manner similar to sub-steps (i) to (iv) for forming the contact features 60, such that the contact vias 71 is electrically connected to the contact features 60, respectively.

In some embodiments, the conductive material for forming each of the contact features 60 and the contact vias 71 may include, for example, but not limited to, W, Al, Ru, cobalt (Co), copper (Cu), palladium (Pd), nickel (Ni), platinum (Pt), a low resistivity metal constituent, or the like, or combinations thereof. In some embodiments, the IMD layer 70 may be made of a dielectric material similar to the dielectric material for forming the ILD feature 27, and thus details thereof are omitted for the sake of brevity. Other suitable materials and/or processes for forming the contact features 60 and the contact vias 71 are within the contemplated scope of the present disclosure. For example, in some embodiments, a metal silicide feature (not shown) is formed between each of the source/drain features 25 and a corresponding one of the contact features 60 for reducing a contact resistance (Rcsd) between each of the source/drain features 25 and the corresponding contact feature 60. In some embodiments, the metal silicide feature may include titanium silicide, ruthenium silicide, nickel silicide, cobalt silicide, molybdenum silicide, or combinations thereof. Other suitable materials for the metal silicide are within the contemplated scope of the present disclosure.

In some embodiments, the semiconductor structure 90 may further include a plurality of interconnect layers each including an IMD feature (not shown) in which electrically conductive elements (not shown, for example, metal contacts, metal lines and/or metal vias) are formed so as to permit the devices 41, 42, 43 to be electrically connected to external circuits through the electrically conductive elements. In some embodiments, the interconnect layers may be formed by a dual damascene process, a single damascene process, or other suitable back-end-of-line (BEOL) techniques.

Figure 32:
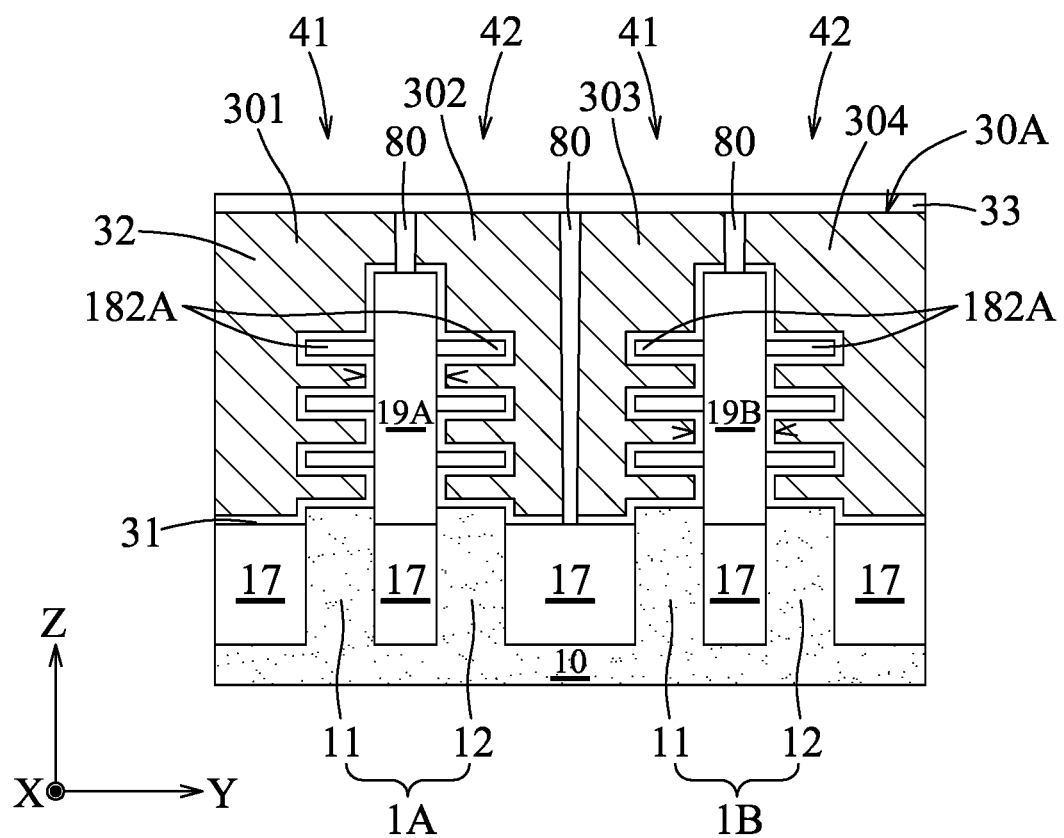

In some embodiments, some steps in the method 100 may be modified, replaced, or eliminated without departure from the spirit and scope of the present disclosure. For example, as shown in FIG. 32, each of the real gate portions 301, 302, 303, 304 in the gate structure 30A may be spaced apart from each other by a corresponding one of isolation sections 80 according to application requirement. Each of the isolation sections 80 may be made of a dielectric material to similar the dielectric material of the gate isolation portion 51, and is independently positioned on a corresponding one of the dielectric walls 19 or a corresponding one of the isolation regions 17. In some embodiments, as shown in FIG. 32, the isolation sections 80 may be formed after formation of the gate structures 30 and before formation of the self-aligned dielectric features 33. In some other not shown embodiments, the isolation sections 80 may be formed after step 107 (i.e., the replacement gate process) and before step 109 (i.e., formation of the contact features 60 and the contact vias 71). In some not shown embodiments, step 108 (i.e., formation of the isolation feature 50) may be performed after step 106 (i.e., formation of the contact etching stop features 26 and the ILD features 27) and before step 107 (i.e., the replacement gate process). In this case, formation of the isolation feature 50 may include removing at least one of the dummy gate portions 20 and portions of elements therebeneath in a way similar to the etching process for removing the gate structure 30C in step 107 to form at least one trench, followed by filling the dielectric material for forming at least one gate isolation portion 51 therein.

In some embodiments, each of the device units 401, 402 may have a forksheet transistor architecture, and each of the device assemblies 403, 404, 405 may have a GAA transistor architecture.

The connection relationship between one of the device units and corresponding one(s) of the device assemblies is described above through the semiconductor structure 90. In the following, four device layouts 91, 92, 93, 94 applied to inverters are exemplified according to the design spirit of the semiconductor structure 90. Similar numerals from the above-mentioned embodiments have been used where appropriate, with some construction differences being indicated with different numerals.

Figure 33:
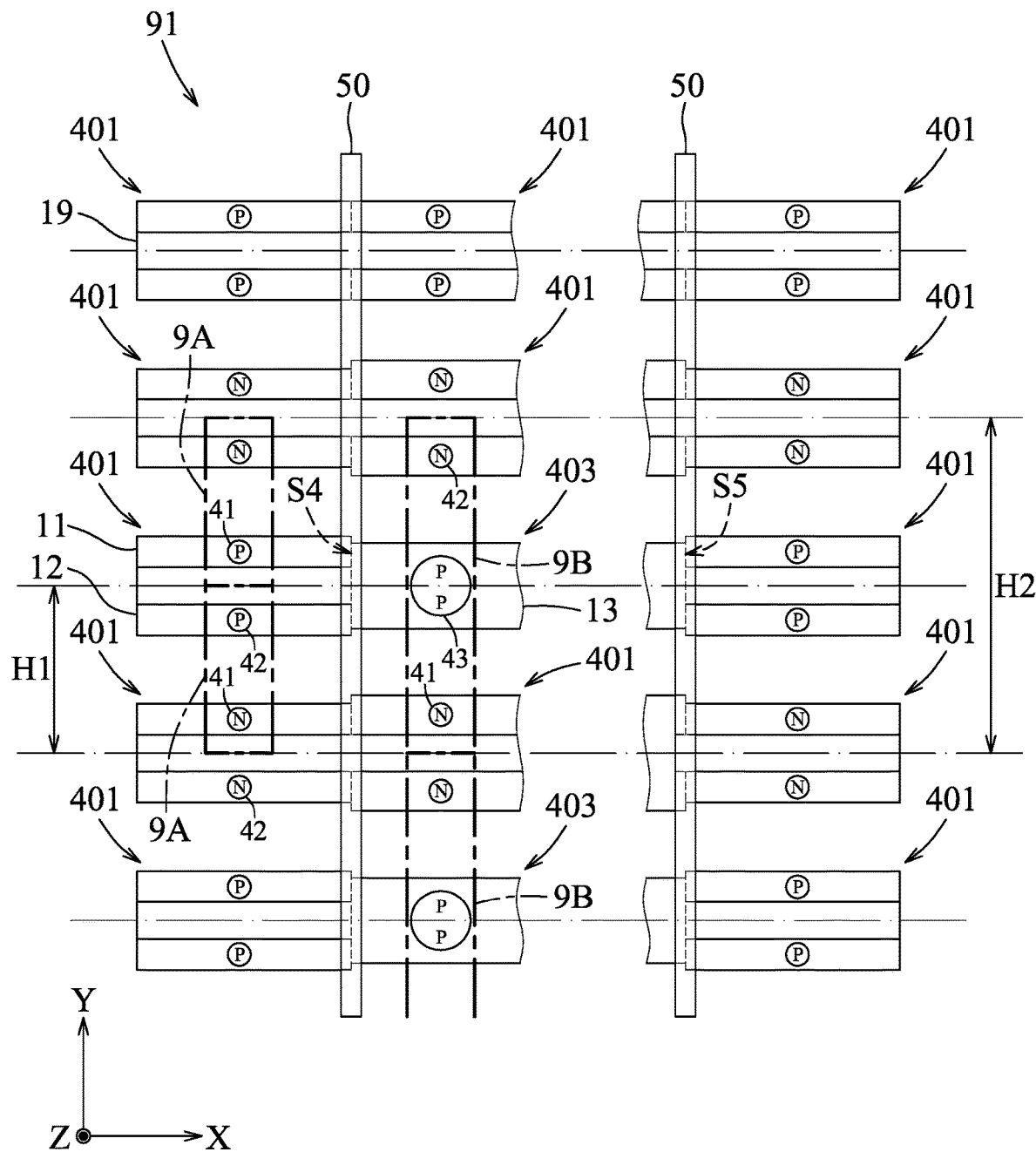
FIGS. 33 to 36 are schematic views respectively illustrating first to fourth device layouts in accordance with some embodiments.

FIG. 33 is a schematic view illustrating a first device layout 91 in accordance with some embodiments. The first device layout 91 includes a plurality of the device units 401 periodically arranged to form an array, a plurality of the device assemblies 403 integrated in the array of the device units 401, and a plurality of the isolation features 50 elongated in the Y direction and spaced apart from each other in the X direction, so that each of the isolation features 50 can electrically isolate any two adjacent ones of the device units 401, and can electrically isolate one of the device units 401 from an adjacent one of the device assemblies 403.

In practical, each of the device units 401 may include a plurality of the first devices 41 disposed on the first fin 11 and a plurality of the second devices 42 disposed on the second fin 12, and each of the device assemblies 403 may include a plurality of the third devices 43 disposed on the third fin 13. In FIG. 33, for the purposes of simplicity and clarity, a single first device 41 and a single second device 42 are shown in each of the device units 401, and a single third device 43 is shown in each of the device assemblies 403. Furthermore, it is noted that the elements (e.g., the source/drain features, the real gate portions, etc.) of each of the devices 41, 42, 43 are omitted in FIG. 33 for the purposes of simplicity and clarity. In FIG. 33, the devices 41, 42 serving as n-FETs are denoted by "N," the devices 41, 42 serving as p-FETs are denoted by "P," and the devices 43 serving as p-FETs are denoted by "PP." The third device 43 has a channel width in the Y direction which is much greater than that of each of the first and second devices 41, 42.

In the first device layout 91, the third fin 13 of each of the device assemblies 403 has a first surface (S4) and a second surface (S5) which are opposite to each other in the X direction. The first surface (S4) of the third fin 13 of one of the device assemblies 403 is in direct contact with the first and second fins 11, 12 of a corresponding one of the device units 401, and the second surface (S5) of the third fin 13 of the one of the device assemblies 403 is in direct contact with the first and second fins 11, 12 of another corresponding one of the device units 401.

It can be seen that a plurality of basic inverter units 9A and a plurality of first advanced inverter units 9B are regularly arranged in the first device layout 91. In the case that in each of the device units 401, the first and second devices 41, 42 have the same type of conductivity, each of the basic inverter units 9A includes an n-FET of one of the device units 401 and a p-FET of a most adjacent one of the device units 401, and may be referred to as a PN inverter. Each of the first advanced inverter units 9B includes (i) a p-FET of one of the device assemblies 403 and (ii) two n-FETs of two most adjacent ones of the device units 401 which are most adjacent to the p-FET of the one of the device assemblies 403 in the Y direction, and may be referred to as an NPN inverter (or an NPPN inverter). In some not shown embodiments, when an n-FET is disposed on one of the device assemblies 403 and two p-FETs are respectively disposed on two most adjacent ones of the device units 401, a PNP inverter (or a PNNP inverter) may be obtained.

Each of the first advanced inverter units 9B has a cell height (H2) which may be two times a cell height (H1) of each of the basic inverter units 9A. The first advanced inverter units 9B have a device performance (e.g., speed) better than that of the basic inverter units 9A owing to a relatively large channel width of the third device 43 in each of the first advanced invertor units 9B. In some embodiments, as shown in FIG. 33, the two n-FETs in each of the first advanced inverter units 9B may have a channel width in the Y direction which is greater than that of the n-FET in the basic inverter unit 9A for further improving the device performance thereof.

Figure 34:
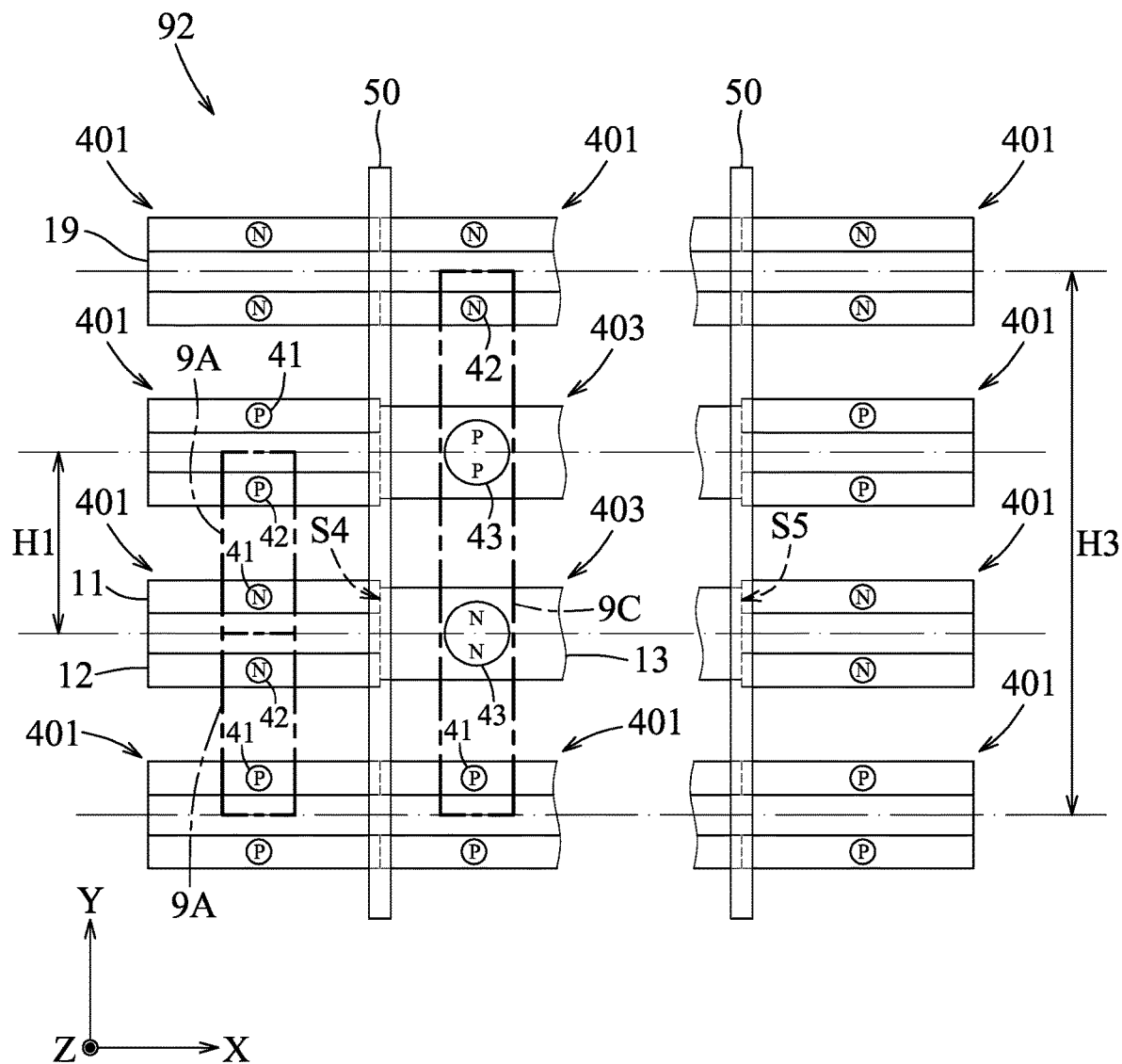

FIG. 34 is a schematic view illustrating a second device layout 92 in accordance with some embodiments. FIG. 34 is a view similar to that of FIG. 33 except that the device assemblies 403 in the second device layout 92 are integrated in the array of the device unit 401 in a different manner.

Similar to the layout shown in FIG. 33, in FIG. 34, the first surface (S4) of the third fin 13 of one of the device assemblies 403 is in direct contact with the first and second fins 11, 12 of a corresponding one of the device units 401, and the second surface (S5) of the third fin 13 of the one of the device assemblies 403 is in direct contact with the first and second fins 11, 12 of another corresponding one of the device units 401. The difference between the layouts shown in FIGS. 33 and 34 is that two of the device assemblies 403, having opposite types of conductivity, are arranged adjacent to each other without the device units 401 being disposed therebetween. One of the third devices 43 shown in FIG. 34 serving as an n-FET is denoted by "NN," and the third devices 43 each has a channel width in the Y direction which is much greater than that of each of the first and second devices 41, 42.

In some embodiments, a plurality of second advanced inverter units 9C (one of which is shown in FIG. 34) may be regularly arranged in the array of the basic inverter units 9A.

The second advanced inverter unit 9C includes (i) a p-FET of one of the device assemblies 403 (hereinafter referred to as "9CPP FET"), (ii) an n-FET of an adjacent one of the device assemblies 403 (hereinafter referred to as "9CNN FET") which is most adjacent to the 9CPP FET in the Y direction, (iii) one of n-FETs of a first adjacent one of the device units 401 (hereinafter referred to as "9CN FET") which is most adjacent to the 9CPP FET in the Y direction, and (iv) one of p-FETs of a second adjacent one of the device units 401 (hereinafter referred to as "9CP FET") which is most adjacent to the n-FET of 9CNN in the Y direction, and may be referred to as a PPNN inverter. In some embodiments, in the second advanced inverter unit 9C, the 9CN FET and the 9CP FET may be dummy FETs.

The second advanced inverter unit 9C has a cell height (H3) which may be three times a cell height (H1) of each of the basic inverter units 9A. The second advanced inverter unit 9C has an improved performance (e.g., speed) than that of the basic inverter units 9A owing to a relatively large channel width of each of the third devices 43 in the second advanced invertor units 9C. In some embodiments, as shown in FIG. 34, in the second advanced inverter unit 9C, when the 9CN FET and the 9CP FET are dummy FETs, channel widths of the 9CN FET and the 9CP FET in the Y direction may be substantially equal to channel widths of the n-FET and the p-FET of the basic inverter units 9A, respectively.

In some not shown embodiments, a variation of the second advanced inverter unit includes a 9CN FET, a 9CPP FET, a 9CNN FET, a 9CPP FET, a 9CNN FET and a 9CP FET, which are arranged in the Y direction in this order. In this case, the variation of the second advanced inverter unit includes two PPNN inverters, and has a cell height which may be five times a cell height (H1) of each of the basic inverter units 9A.

Figure 35:
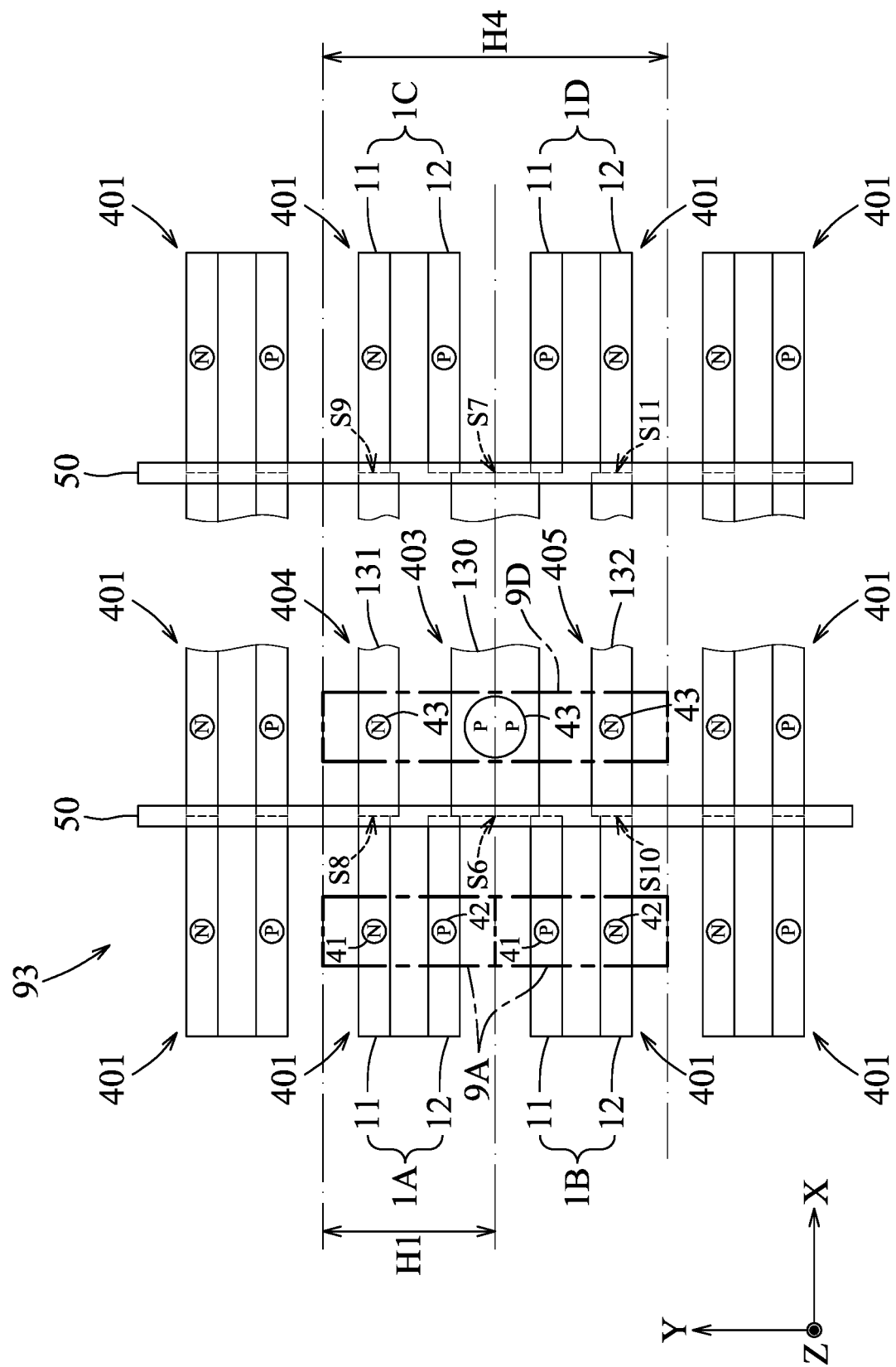

FIG. 35 is a schematic view illustrating a third device layout 93 in accordance with some embodiments. FIG. 35 is a view similar to that of FIG. 33 except that the third device layout 93 includes three of the device assemblies 403, 404, 405 which are arranged adjacent to one another and which are arranged to connect with four of the device units 401 in the array of the device units 401. A plurality of the isolation features 50 are disposed to electrically isolate any two adjacent ones of the device units 401, and to electrically isolate one of the device units 401 from an adjacent one of the device assemblies 403, 404, 405.

As shown in FIG. 35, one of the third devices 43 disposed on the main fin 130 serves as a p-FET, and is denoted by "PP," and the one of the third devices 43 disposed on the main fin 130 has a channel width in the Y direction which is much greater than that of each of the first and second devices 41, 42. The other two of the third devices 43 which are respectively disposed on the first and second auxiliary fins 131, 132 serve as n-FETs, and are denoted by "N." The other two of the third devices 43 each has a channel width in the Y direction which is greater than that of each of the first and second devices 41, 42 and which is smaller than that of the third device 43 disposed on the main fin 130.

In the third device layout 93, each of the main fin 130 and the first and second auxiliary fins 131, 132 has a first surface (S6, S8, S10) and a second surface (S7, S9, S11) which are opposite to each other in the X direction. The first surface (S6) of the main fin 130 of the device assembly 403 is in direct contact with the second fin 12 of the first pair 1A and the first fin 11 of the second pair 1B. The second surface (S7) of the main fin 130 is in direct contact with the second fin 12 of a third pair 1C and the first fin 11 of a fourth pair 1D. The first surface (S8) of the first auxiliary fin 131 of the device assembly 404 is in direct contact with the first fin 11 of the first pair 1A, and the second surface (S9) of the first auxiliary fin 131 is in direct contact with the first fin 11 of the third pair 1C. The first surface (S10) of the second auxiliary fin 132 of the device assembly 405 is in direct contact with the second fin 12 of the second pair 1B, and the second surface (S11) of the second auxiliary fin 132 is in direct contact with the second fin 12 of the fourth pair 1D.

In some embodiments, as shown in FIG. 35, in each of the device units 401, the first and second devices 41, 42 have opposite types of conductivity, and a plurality of third advanced inverter units 9D (one of which is shown in FIG. 35) may be regularly arranged in the array of the basic inverter units 9A.

Each of the basic inverter units 9A includes an n-FET and a p-FET in the same one of the device units 401, and may be referred to as a PN inverter. The third advanced inverter unit 9D includes a p-FET in the device assembly 403, and two n-FETs respectively in the device assemblies 404, 405, and may be referred to as an NPN inverter (or an NPPN inverter). In some not shown embodiments, when an n-FET is disposed on the device assembly 403 and two p-FETs are respectively disposed on the device assemblies 404, 405, a PNP inverter (or a PNNP inverter) may be obtained.

The third advanced inverter unit 9D has a cell height (H4) which may be two times a cell height (H1) of each of the basic inverter units 9A. The third advanced inverter unit 9D has a device performance (e.g., speed) better than that of the basic inverter units 9A owing to a relatively large channel width of at least one of the third devices 43 in the third advanced invertor unit 9D.

Figure 36:
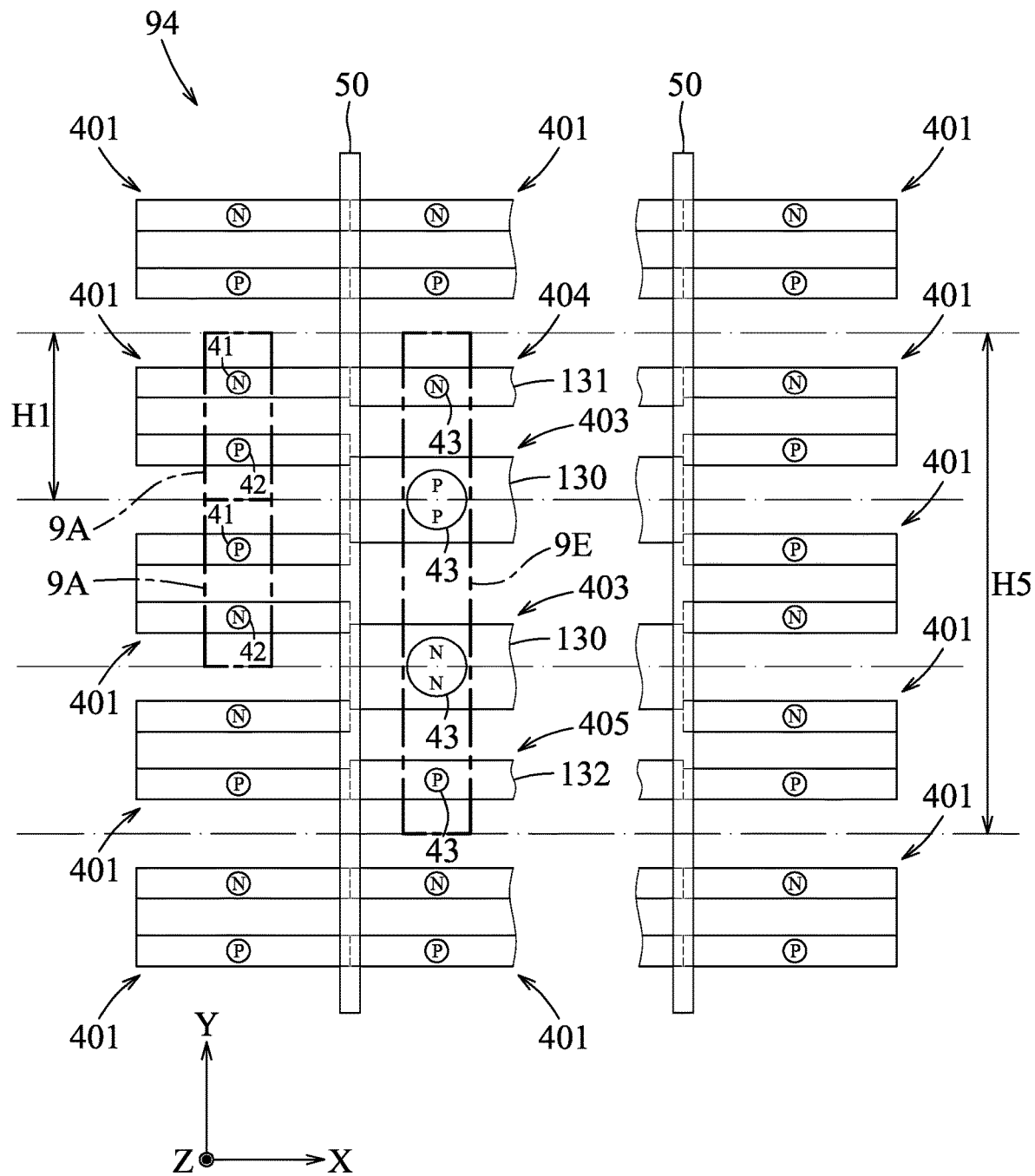

FIG. 36 is a schematic view illustrating a fourth device layout 94 in accordance with some embodiments. FIG. 36 is a view similar to that of FIG. 35 except that the fourth device layout 94 includes four of the device assemblies 403, 404, 405 which are arranged adjacent to one another and which are arranged to connect with six of the device units 401 in the array of the device units 401. The two device assemblies 403 are disposed between the device assemblies 404, 405. As shown in FIG. 36, the third device 43 disposed on the main fin 130 of one of the device assemblies 403 serves as an n-FET, and is denoted by "NN," while the third device 43 disposed on the second auxiliary fin 132 serves as a p-FET, and is denoted by "P."

In some embodiments, as shown in FIG. 36, a plurality of fourth advanced inverter units 9E (one of which is shown in FIG. 36) may be regularly arranged in the array of the basic inverter units 9A.

The fourth advanced inverter unit 9E includes a p-FET of one of the device assemblies 403 (hereinafter referred to as "9EPP FET"), an n-FET of an adjacent one of the device assemblies 403 (hereinafter referred to as "9ENN FET"), an n-FET of the device assembly 404 (hereinafter referred to as "9EN FET"), and a p-FET of the device assembly 405 (hereinafter referred to as "9EP FET"), and may be referred to as a PPNN inverter. In some embodiments, the 9EN FET and the 9EP FET may be dummy FETs.

The fourth advanced inverter units 9E has a cell height (H5) which may be three times a cell height (H1) of each of the basic inverter units 9A. The fourth advanced inverter units 9E has an improved device performance (e.g., speed) than that of the basic inverter units 9A owing to a relatively large channel width of at least two of the third devices 43 of the device assemblies 403 in the fourth advanced invertor units 9E. In some embodiments, as shown in FIG. 36, when the 9EN FET and the 9EP FET are dummy FETs, channel widths of the 9EN FET and the 9EP FET in the Y direction may be substantially equal to channel widths of the n-FET and the p-FET of the basic inverter unit 9A, respectively.

In some not shown embodiments, a variation of the fourth advanced inverter unit includes a 9EN FET, a 9EPP FET, a 9ENN FET, a 9EPP FET, a 9ENN FET, and a 9EP FET, which are arranged in the Y direction in such order. In this case, the variation of the fourth advanced inverter unit may include two PPNN inverters, and has a cell height which may be five times a cell height (H1) of each of the basic inverter units 9A.

In the semiconductor structure of this disclosure, the fins of at least one device unit (which includes a plurality of basic devices, i.e., the first and second devices) and at least one device assembly (which includes at least one high performance device, i.e., the third device(s)) are directly connected to each other. By arrangement between at least one isolation feature and the dielectric wall of the at least one device unit in the semiconductor structure, a plurality of the basic devices and a plurality of the high performance devices can be electrically isolated from one another while being integrated together with a high integration density. Furthermore, taking the inverter as an example, since a cell height of the high performance inverter unit is an integral multiple of a cell height of each of the basic inverter units, the high performance inverter unit may be easily arranged in an array of the basic inverter units. Therefore, the semiconductor structure of this disclosure has a good integration compatibility, and provides a flexible strategy capable of integrating high performance devices into an existing device layout.

In accordance with some embodiments of the present disclosure, a semiconductor structure includes: a substrate, a first fin, a second fin, a third fin, a dielectric wall, and an isolation feature which are disposed on the substrate; and a first device, a second device and at least one third device which are respectively disposed on the first, second and third fins. The first and second fins are spaced apart from each other. The third fin is disposed to be in direct contact with at least one of the first and second fins. The dielectric wall has a first wall surface and a second wall surface. The first device includes a plurality of first channel features which extend away from the first wall surface and which are spaced apart from each other, and two first source/drain features spaced apart from each other such that each of the first channel features interconnects the first source/drain features. The second device includes a plurality of second channel features which extend away from the second wall surface and which are spaced apart from each other, and two second source/drain features spaced apart from each other such that each of the second channel features interconnects the second source/drain features. The at least one third device includes a plurality of third channel features which are spaced apart from each other, and two third source/drain features spaced apart from each other such that each of the third channel features interconnects the third source/drain features. The isolation feature is disposed to permit the third device to be electrically isolated from the first and second devices.

In accordance with some embodiments of the present disclosure, the first and second fins are spaced apart from each other in a Y direction, and are elongated in an X direction transverse to the Y direction. The first and second wall surfaces are opposite to each other in the Y direction. The first channel features are spaced apart from each other in a Z direction transverse to both the X and Y directions, and each of the first channel features extends from the first wall surface in the Y direction by a first channel width. The second channel features are spaced apart from each other in the Z direction, and each of the second channel features extends from the second wall surface in the Y direction by a second channel width. The third channel features are spaced apart from each other in the Z direction, and each of the third channel features has a third channel width in the Y direction. The third channel width is greater than each of the first and second channel widths.

In accordance with some embodiments of the present disclosure, the semiconductor structure further includes a first real gate portion, a second real gate portion and a third real gate portion. The first real gate portion is disposed around the first channel features, and the second real gate portion is disposed around the second channel features. The first and second real gate portions extend toward each other in the Y direction to merge on the dielectric wall such that the two first source/drain features are respectively located at two opposite sides of the first real gate portion in the X direction, and such that the two second source/drain features are respectively located at two opposite sides of the second real gate portion in the X direction. The third real gate portion is spaced apart from the first real gate portion in the X direction, and is elongated in the Y direction. The third real gate portion is disposed to surround the third channel features, and has a gate width in the X direction which is greater than a gate width of each of the first and second real gate portions in the X direction.

In accordance with some embodiments of the present disclosure, the isolation feature is spaced apart from each of the first, second and third real gate portions in the X direction. The dielectric wall has an end surface interconnecting the first and second wall surfaces, and is spaced apart from the third device. The isolation feature includes a gate isolation portion which is made of a dielectric material, and which is elongated in the Y direction. The gate isolation portion is being disposed to be in direct contact with the end surface of the dielectric wall, such that the first and second devices are isolated from each other.

In accordance with some embodiments of the present disclosure, the isolation feature is spaced apart from each of the first, second and third real gate portions in the X direction. The dielectric wall has an end surface interconnecting the first and second wall surfaces. The isolation feature includes two gate isolation portions which are elongated in the Y direction, which are spaced apart from each other in the X direction, and which are disposed at two opposite sides of the end surface of the dielectric wall. A proximate one of the gate isolation portions is disposed to penetrate the dielectric wall, and a distal one of the gate isolation portions is disposed to be spaced apart from the end surface of the dielectric wall.

In accordance with some embodiments of the present disclosure, the isolation feature has a bottom surface at a level lower than a bottom surface of each of the first, second and third source/drain features, so as to electrically isolate the first, second and third devices from one another.

In accordance with some embodiments of the present disclosure, the third fin is in direct contact with both of the first and second fins. The isolation feature is disposed to elongate in the Y direction such that the third device is separated from the first and second devices by the isolation feature.

In accordance with some embodiments of the present disclosure, the third fin is in direct contact with the second fin. The semiconductor structure further includes a fourth fin disposed on the substrate, a fourth device disposed on the fourth fin, a first real gate portion, a second real gate portion, a third real gate portion, and a fourth real gate portion. The fourth fin is spaced apart from the third fin in the Y direction, and is elongated in the X direction to be in contact with the first fin. The fourth device includes a plurality of fourth channel features which are spaced apart from each other in the Z direction, and two fourth source/drain features spaced apart from each other in the X direction such that each of the fourth channel features interconnects the fourth source/drain features. The first real gate portion is disposed around the first channel features, and the second real gate portion is disposed around the second channel features. The first and second real gate portions extend toward each other in the Y direction to merge on the dielectric wall such that the two first source/drain features are respectively located at two opposite sides of the first real gate portion in the X direction, and such that the two second source/drain features are respectively located at two opposite sides of the second real gate portion in the X direction. The third real gate portion and the fourth real gate portion are spaced apart from the first and second real gate portions in the X direction. The third real gate portion is disposed to surround the third channel features, and the fourth real gate portion is disposed to surround the fourth channel features. The third and fourth real gate portions extend toward each other in the Y direction to merge together such that the two third source/drain features are respectively located at two opposite sides of the third real gate portion in the X direction, and such that the two fourth source/drain features are respectively located at two opposite sides of the fourth real gate portion in the X direction.

In accordance with some embodiments of the present disclosure, a semiconductor structure includes a substrate, at least one device unit, at least one device assembly and an isolation feature which are disposed on the substrate. The at least one device unit includes a first fin and a second fin which are spaced apart from each other in a Y direction, a dielectric wall which has a first wall surface and a second wall surface opposite to the first wall surface, and a first device and a second device which are respectively disposed on the first and second fins. Each of the first and second devices includes a plurality of channel features which extend away from a corresponding one of the first and second wall surface to be disposed over a corresponding one of the first and second fins so as to permit the channel features to be spaced apart from each other in a Z direction transverse to the Y direction, and two source/drain features which are disposed on a corresponding one of the first and second fins, and which are spaced apart from each other in an X direction transverse to the Y and Z directions such that each of the channel features interconnects the two source/drain features. The at least one device assembly includes a third fin which is in direct contact with at least one of the first and second fin, and a third device which is disposed on the third fin. The third device includes a plurality of channel features spaced apart from each other in the Z direction, and two source/drain features disposed on the third fin and spaced apart from each other in the X direction such that each of the channel features interconnects the two source/drain features. The isolation feature extends in the Y direction through the first and second fins of the at least one device unit and through the third fin of the at least one device assembly so as to permit the third device to be electrically isolated from the first and second devices.

In accordance with some embodiments of the present disclosure, the semiconductor structure includes two of the device units which are spaced apart in the Y direction. The third fin of the at least one device assembly is in direct contact with the second fin of a first one of the device units and the first fin of a second one of the device units. The isolation feature extends in the Y direction through the first and second fins of the device units and through the third fin of the at least one device assembly.

In accordance with some embodiments of the present disclosure, the semiconductor structure includes two of the device units which are spaced apart in the Y direction, and three of the device assemblies which are spaced apart in the Y direction. The third fin of a middle one of the device assemblies is in direct contact with the second fin of a first one of the device units and the first fin of a second one of the device units. The second fin of the first one of the device units is disposed to confront the first fin of the second one of the device units in the Y direction. A first one of the device assemblies and a second one of the device assemblies are disposed at two opposite sides of the middle one of the device assemblies in the Y direction. The third fin of the first one of the device assemblies is in direct contact with the first fin of the first one of the device units. The third fin of the second one of the device assemblies is in direct contact with the second fin of the second one of the device units. The isolation feature extends in the Y direction through the first and second fins of the device units and through the third fins of the device assemblies.

In accordance with some embodiments of the present disclosure, each of the channel features of the middle one of the device assemblies has a channel width in the Y direction which is greater than a channel width of each of the channel features of each of the device units in the Y direction.

In accordance with some embodiments of the present disclosure, each of the channel features of the middle one of the device assemblies has a channel width in the Y direction which is greater than the channel width of each of the channel features of the first and second ones of the device assemblies in the Y direction.

In accordance with some embodiments of the present disclosure, the source/drain features of the middle one of the device assemblies have a conductivity type different from a conductivity type of the source/drain features of the first and second ones of the device assemblies.

In accordance with some embodiments of the present disclosure, a method for manufacturing a semiconductor structure includes forming a patterned structure, forming a dielectric wall, forming a first device, a second device and a third device, and forming an isolation feature. The patterned structure is formed on a substrate. The patterned structure includes a first fin, a second fin and a third fin disposed on the substrate. The first and second fins are elongated in an X direction, and are spaced apart from each other in a Y direction transverse to the X direction. The third fin is in direct contact with at least one of the first and second fins. The dielectric wall is formed on the substrate, and has a first wall surface and a second wall surface. The first, second and third devices are respectively formed on the first, second and third fins. The first device includes a plurality of first channel features which extend away from the first wall surface and which are spaced apart from each other in a Z direction transverse to the X and Y directions, a first real gate portion which is disposed around the first channel features, and two first source/drain features which are located at two opposite sides of the first real gate portion to be spaced apart from each other in the X direction such that each of the first channel features interconnects the first source/drain features. The second device includes a plurality of second channel features which extend away from the second wall surface and which are spaced apart from each other in the Z direction, a second real gate portion which is disposed around the second channel features, and two second source/drain features which are located at two opposite sides of the second real gate portion to be spaced apart from each other in the X direction such that each of the second channel features interconnects the second source/drain features. The third device includes a plurality of third channel features which are spaced apart from each other in the Z direction, a third real gate portion which is disposed around the third channel features, and two third source/drain features which are located at two opposite sides of the third real gate portion to be spaced apart from each other in the X direction such that each of the third channel features interconnects the third source/drain features. The isolation feature is formed on the substrate. The isolation feature extends in the Y direction through the first, second and third fins to permit the third device to be electrically isolated from the first and second devices.

In accordance with some embodiments of the present disclosure, the third fin has a fin width in the Y direction which is greater than a fin width of each of the first and second fins in the Y direction.

In accordance with some embodiments of the present disclosure, the dielectric wall has an end surface interconnecting the first and second wall surfaces, and the isolation feature includes a gate isolation portion. Forming the first, second and third devices includes (i) forming a first dummy gate portion disposed over the first and second fins and the dielectric wall, a second dummy gate portion disposed over the first, second and third fins, and a third dummy gate portion disposed over the third fin, the first, second and third dummy gate portions being spaced apart from each other in the X direction, and (ii) performing a replacement gate process such that the first dummy gate portion is replaced with a first gate structure including the first and second real gate portions, the second dummy gate portion is replaced with a second gate structure, and the third dummy gate portion is replaced with a third gate structure including the third real gate portion. Forming the isolation feature includes (i) performing an etching process until the second gate structure is removed and portions of the first, second and third fins beneath the second gate structure are partially removed so as to form a trench which has a bottom at a level lower than a bottom surface of each of the first, second, and third source/drain features, and (ii) filling a dielectric material into the trench so as to form the gate isolation portion which is in direct contact with the end surface of the dielectric wall.

In accordance with some embodiments of the present disclosure, the dielectric wall has an end surface interconnecting the first and second wall surfaces, and the isolation feature includes a gate isolation portion. Forming the first, second and third devices and the isolation feature includes (i) forming a first dummy gate portion disposed over the first and second fins, a second dummy gate portion disposed over the first, second and third fins, and a third dummy gate portion disposed over the third fin, the first, second and third dummy gate portions being spaced apart from each other in the X direction, (ii) performing an etching process until the second dummy gate portion and portions of the first, second and third fins beneath the second dummy gate portion are partially removed so as to form a trench having a bottom at a level lower than a bottom surface of each of the first, second, and third source/drain features, (iii) filling a dielectric material into the trench so as to form the gate isolation portion which is in direct contact with the end surface of the dielectric wall, and (iv) performing a replacement gate process such that the first dummy gate portion is replaced with a first gate structure including the first and second real gate portions, and the third dummy gate portion is replaced with a second gate structure including the third real gate portion.

In accordance with some embodiments of the present disclosure, the dielectric wall has an end surface interconnecting the first and second wall surfaces, and the isolation feature includes two gate isolation portions. Forming the first, second and third devices includes (i) forming first and second dummy gate portions disposed over the first and second fins and the dielectric wall, and third and fourth dummy gate portions disposed over the third fin, the first, second, third and fourth dummy gate portions being spaced apart from each other in the X direction, the second and third dummy gate portions being disposed between the first and fourth dummy gate portions, and (ii) performing a replacement gate process such that the first dummy gate portion is replaced with a first gate structure including the first and second real gate portions, the second and third dummy gate portions are respectively replaced with second and third gate structures, and the fourth dummy gate portion is replaced with a fourth gate structure including the third real gate portion. Forming the isolation feature includes (i) performing an etching process until the second and third gate structures are removed, portions of the first and second fins beneath the second gate structure are partially removed, and a portion of the third fin beneath the third gate structure is partially removed so as to form two trenches each having a bottom at a level lower than a bottom surface of each of the first, second, and third source/drain features, and (ii) filling a dielectric material into the trenches so as to respectively form the two gate isolation portions which are located at two opposite sides of the end surface of the dielectric wall.

In accordance with some embodiments of the present disclosure, the isolation feature has a bottom surface at a level lower than a bottom surface of each of the first, second, and third source/drain features.

The foregoing outlines features of several embodiments so that those skilled in the art may better understand the aspects of the present disclosure. Those skilled in the art should appreciate that they may readily use the present disclosure as a basis for designing or modifying other processes or structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor structure comprising:
a substrate;
a first fin and a second fin which are disposed on the substrate, and which are spaced apart from each other;
a dielectric wall disposed on the substrate, and having a first wall surface and a second wall surface;
a third fin disposed on the substrate to be in direct contact with at least one of the first and second fins;
a first device disposed on the first fin and including
a plurality of first channel features which extend away from the first wall surface and which are spaced apart from each other, and
two first source/drain features spaced apart from each other such that each of the first channel features interconnects the first source/drain features;
a second device disposed on the second fin and including
a plurality of second channel features which extend away from the second wall surface and which are spaced apart from each other, and
two second source/drain features spaced apart from each other such that each of the second channel features interconnects the second source/drain features;
at least one third device disposed on the third fin and including
a plurality of third channel features which are spaced apart from each other, and
two third source/drain features spaced apart from each other such that each of the third channel features interconnects the third source/drain features; and
an isolation feature disposed on the substrate to permit the third device to be electrically isolated from the first and second devices.

2. The semiconductor structure of claim 1, wherein:
the first and second fins are spaced apart from each other in a Y direction, and are elongated in an X direction transverse to the Y direction;
the first and second wall surfaces are opposite to each other in the Y direction;
the first channel features are spaced apart from each other in a Z direction transverse to both the X and Y directions, each of the first channel features extending from the first wall surface in the Y direction by a first channel width;
the second channel features are spaced apart from each other in the Z direction, each of the second channel features extending from the second wall surface in the Y direction by a second channel width;
the third channel features are spaced apart from each other in the Z direction, each of the third channel features having a third channel width in the Y direction; and
the third channel width is greater than each of the first and second channel widths.

3. The semiconductor structure of claim 2, further comprising:

a first real gate portion and a second real gate portion, the first real gate portion being disposed around the first channel features, the second real gate portion being disposed around the second channel features, the first and second real gate portions extending toward each other in the Y direction to merge on the dielectric wall such that the two first source/drain features are respectively located at two opposite sides of the first real gate portion in the X direction, and such that the two second source/drain features are respectively located at two opposite sides of the second real gate portion in the X direction; and a third real gate portion spaced apart from the first real gate portion in the X direction and elongated in the Y direction, the third real gate portion being disposed to surround the third channel features, the third real gate portion having a gate width in the X direction which is greater than a gate width of each of the first and second real gate portions in the X direction.

4. The semiconductor structure of claim 3, wherein:
the isolation feature is spaced apart from each of the first, second and third real gate portions in the X direction;
the dielectric wall has an end surface interconnecting the first and second wall surfaces, and is spaced apart from the third device;
the isolation feature includes a gate isolation portion made of a dielectric material, and is elongated in the Y direction, the gate isolation portion being disposed to be in direct contact with the end surface of the dielectric wall, such that the first and second devices are isolated from each other.

5. The semiconductor structure of claim 3, wherein:
the isolation feature is spaced apart from each of the first, second and third real gate portions in the X direction;
the dielectric wall has an end surface interconnecting the first and second wall surfaces;
the isolation feature includes two gate isolation portions which are elongated in the Y direction, which are spaced apart from each other in the X direction, and which are located at two opposite sides of the end surface of the dielectric wall, a proximate one of the gate isolation portions being disposed to penetrate the dielectric wall, a distal one of the gate isolation portions being disposed to be spaced apart from the end surface of the dielectric wall.

6. The semiconductor structure of claim 1, wherein the isolation feature has a bottom surface at a level lower than a bottom surface of each of the first, second and third source/drain features, so as to electrically isolate the first, second and third devices from one another.

7. The semiconductor structure of claim 2, wherein:
the third fin is in direct contact with both of the first and second fins; and
the isolation feature is disposed to elongate in the Y direction such that the third device is separated from the first and second devices by the isolation feature.

8. The semiconductor structure of claim 2, wherein the third fin is in direct contact with the second fin, the semiconductor structure further comprising:
a fourth fin disposed on the substrate and spaced apart from the third fin in the Y direction, the fourth fin being elongated in the X direction to be in contact with the first fin;
a fourth device disposed on the fourth fin and including a plurality of fourth channel features which are spaced apart from each other in the Z direction, and two fourth source/drain features spaced apart from each other in the X direction such that each of the fourth channel features interconnects the fourth source/drain features;

a first real gate portion and a second real gate portion, the first real gate portion being disposed around the first channel features, the second real gate portion being disposed around the second channel features, the first and second real gate portions extending toward each other in the Y direction to merge on the dielectric wall such that the two first source/drain features are respectively located at two opposite sides of the first real gate portion in the X direction, and such that the two second source/drain features are respectively located at two opposite sides of the second real gate portion in the X direction; and a third real gate portion and a fourth real gate portion which are spaced apart from the first and second real gate portions in the X direction, the third real gate portion being disposed to surround the third channel features, the fourth real gate portion being disposed to surround the fourth channel features, the third and fourth real gate portions extending toward each other in the Y direction to merge together such that the two third source/drain features are respectively located at two opposite sides of the third real gate portion in the X direction, and such that the two fourth source/drain features are respectively located at two opposite sides of the fourth real gate portion in the X direction.

9. A semiconductor structure, comprising:
a substrate;
at least one device unit disposed on the substrate, and including
a first fin and a second fin which are spaced apart from each other in a Y direction,
a dielectric wall which has a first wall surface and a second wall surface opposite to the first wall surface, and
a first device and a second device which are respectively disposed on the first and second fins, each of the first and second devices including
a plurality of channel features which extend away from a corresponding one of the first and second wall surface to be disposed over a corresponding one of the first and second fins so as to permit the channel features to be spaced apart from each other in a Z direction transverse to the Y direction, and
two source/drain features which are disposed on a corresponding one of the first and second fins, and which are spaced apart from each other in an X direction transverse to the Y and Z directions such that each of the channel features interconnects the two source/drain features;
at least one device assembly disposed on the substrate, and including
a third fin which is in direct contact with at least one of the first and second fin, and
a third device which is disposed on the third fin, and including
a plurality of channel features spaced apart from each other in the Z direction, and
two source/drain features disposed on the third fin and spaced apart from each other in the X direction such that each of the channel features interconnects the two source/drain features; and an isolation feature disposed on the substrate and extending in the Y direction through the first and second fins of the at least one device unit and through the third fin of the at least one device assembly so as to permit the third device to be electrically isolated from the first and second devices.

10. The semiconductor structure of claim 9, wherein:
the semiconductor structure comprises two of the device units which are spaced apart in the Y direction;
the third fin of the at least one device assembly is in direct contact with the second fin of a first one of the device units and the first fin of a second one of the device units; and
the isolation feature extends in the Y direction through the first and second fins of the device units and through the third fin of the at least one device assembly.

11. The semiconductor structure of claim 9, wherein:
the semiconductor structure comprises two of the device units which are spaced apart in the Y direction, and three of the device assemblies which are spaced apart in the Y direction;
the third fin of a middle one of the device assemblies is in direct contact with the second fin of a first one of the device units and the first fin of a second one of the device units;
the second fin of the first one of the device units is disposed to confront the first fin of the second one of the device units in the Y direction;
a first one of the device assemblies and a second one of the device assemblies are disposed at two opposite sides of the middle one of the device assemblies in the Y direction;
the third fin of the first one of the device assemblies is in direct contact with the first fin of the first one of the device units;
the third fin of the second one of the device assemblies is in direct contact with the second fin of the second one of the device units; and
the isolation feature extends in the Y direction through the first and second fins of the device units and through the third fins of the device assemblies.

12. The semiconductor structure of claim 11, wherein each of the channel features of the middle one of the device assemblies has a channel width in the Y direction which is greater than a channel width of each of the channel features of each of the device units in the Y direction.

13. The semiconductor structure of claim 10, wherein each of the channel features of the middle one of the device assemblies has a channel width in the Y direction which is greater than the channel width of each of the channel features of the first and second ones of the device assemblies in the Y direction.

14. The semiconductor structure of claim 10, wherein the source/drain features of the middle one of the device assemblies have a conductivity type different from a conductivity type of the source/drain features of the first and second ones of the device assemblies.

15. A method for manufacturing a semiconductor structure, comprising:
forming a patterned structure on a substrate, the patterned structure including a first fin, a second fin and a third fin disposed on the substrate, the first and second fins being elongated in an X direction and spaced apart from each other in a Y direction transverse to the X direction, the third fin being in direct contact with at least one of the first and second fins;
forming a dielectric wall on the substrate, the dielectric wall having a first wall surface and a second wall surface;
forming a first device, a second device and a third device respectively on the first, second and third fins,
the first device including
a plurality of first channel features which extend away from the first wall surface and which are spaced apart from each other in a Z direction transverse to the X and Y directions,
a first real gate portion which is disposed around the first channel features, and
two first source/drain features which are located at two opposite sides of the first real gate portion to be spaced apart from each other in the X direction such that each of the first channel features interconnects the first source/drain features,
the second device including
a plurality of second channel features which extend away from the second wall surface and which are spaced apart from each other in the Z direction,
a second real gate portion which is disposed around the second channel features, and
two second source/drain features which are located at two opposite sides of the second real gate portion to be spaced apart from each other in the X direction such that each of the second channel features interconnects the second source/drain features,
the third device including
a plurality of third channel features which are spaced apart from each other in the Z direction,
a third real gate portion which is disposed around the third channel features, and
two third source/drain features which are located at two opposite sides of the third real gate portion to be spaced apart from each other in the X direction such that each of the third channel features interconnects the third source/drain features; and
forming an isolation feature on the substrate, the isolation feature extending in the Y direction through the first, second and third fins to permit the third device to be electrically isolated from the first and second devices.

16. The method of claim 15, wherein the third fin has a fin width in the Y direction which is greater than a fin width of each of the first and second fins in the Y direction.

17. The method of claim 15, wherein:
the dielectric wall has an end surface interconnecting the first and second wall surfaces;
the isolation feature includes a gate isolation portion;
forming the first, second and third devices includes
forming a first dummy gate portion disposed over the first and second fins and the dielectric wall, a second dummy gate portion disposed over the first, second and third fins, and a third dummy gate portion disposed over the third fin, the first, second and third dummy gate portions being spaced apart from each other in the X direction, and
performing a replacement gate process such that the first dummy gate portion is replaced with a first gate structure including the first and second real gate portions, the second dummy gate portion is replaced with a second gate structure, and the third dummy gate portion is replaced with a third gate structure including the third real gate portion; and forming the isolation feature includes
  performing an etching process until the second gate structure is removed and portions of the first, second and third fins beneath the second gate structure are partially removed so as to form a trench which has a bottom at a level lower than a bottom surface of each of the first, second, and third source/drain features, and
  filling a dielectric material into the trench so as to form the gate isolation portion which is in direct contact with the end surface of the dielectric wall.

18. The method of claim 15, wherein:
the dielectric wall has an end surface interconnecting the first and second wall surfaces;
the isolation feature includes a gate isolation portion; and
forming the first, second and third devices and the isolation feature includes
  forming a first dummy gate portion disposed over the first and second fins, a second dummy gate portion disposed over the first, second and third fins, and a third dummy gate portion disposed over the third fin, the first, second and third dummy gate portions being spaced apart from each other in the X direction,
  performing an etching process until the second dummy gate portion and portions of the first, second and third fins beneath the second dummy gate portion are partially removed so as to form a trench having a bottom at a level lower than a bottom surface of each of the first, second, and third source/drain features,
  filling a dielectric material into the trench so as to form the gate isolation portion which is in direct contact with the end surface of the dielectric wall, and
  performing a replacement gate process such that the first dummy gate portion is replaced with a first gate structure including the first and second real gate portions, and the third dummy gate portion is replaced with a second gate structure including the third real gate portion.

19. The method of claim 15, wherein:
the dielectric wall has an end surface interconnecting the first and second wall surfaces;
the isolation feature includes two gate isolation portions;
forming the first, second and third devices includes
  forming first and second dummy gate portions disposed over the first and second fins and the dielectric wall, and third and fourth dummy gate portions disposed over the third fin, the first, second, third and fourth dummy gate portions being spaced apart from each other in the X direction, the second and third dummy gate portions being disposed between the first and fourth dummy gate portions, and
  performing a replacement gate process such that the first dummy gate portion is replaced with a first gate structure including the first and second real gate portions, the second and third dummy gate portions are respectively replaced with second and third gate structures, and the fourth dummy gate portion is replaced with a fourth gate structure including the third real gate portion; and
forming the isolation feature includes
  performing an etching process until the second and third gate structures are removed, portions of the first and second fins beneath the second gate structure are partially removed, and a portion of the third fin beneath the third gate structure is partially removed so as to form two trenches each having a bottom at a level lower than a bottom surface of each of the first, second, and third source/drain features, and
  filling a dielectric material into the trenches so as to respectively form the two gate isolation portions which are located at two opposite sides of the end surface of the dielectric wall.

20. The method of claim 15, wherein the isolation feature has a bottom surface at a level lower than a bottom surface of each of the first, second, and third source/drain features.

* * * * *